(12) United States Patent
Harbers et al.

(10) Patent No.: US 7,942,556 B2
(45) Date of Patent: May 17, 2011

(54) SOLID STATE ILLUMINATION DEVICE

(75) Inventors: Gerard Harbers, Sunnyvale, CA (US); Mark A. Pugh, Los Gatos, CA (US)

(73) Assignee: Xicato, Inc., San Jose, CA (US)

( * ) Notice: Subject to any disclaimer, the term of this patent is extended or adjusted under 35 U.S.C. 154(b) by 550 days.

(21) Appl. No.: 12/015,474

(22) Filed: Jan. 16, 2008

(65) Prior Publication Data
US 2008/0310158 A1    Dec. 18, 2008

Related U.S. Application Data

(60) Provisional application No. 60/944,538, filed on Jun. 18, 2007.

(51) Int. Cl.
*F21V 29/00* (2006.01)
(52) U.S. Cl. .......... 362/294; 362/373; 362/800; 362/84; 362/230; 362/231
(58) Field of Classification Search .................. 362/294, 362/373, 800, 84, 230, 231
See application file for complete search history.

(56) References Cited

U.S. PATENT DOCUMENTS

| | | | |
|---|---|---|---|
| 3,593,055 | A | 7/1971 | Geusic et al. |
| 4,935,665 | A | 6/1990 | Murata |
| 5,959,316 | A | 9/1999 | Lowery |
| 5,962,971 | A | 10/1999 | Chen |
| 5,966,393 | A | 10/1999 | Hide et al. |
| 5,982,092 | A | 11/1999 | Chen |
| 5,998,925 | A | 12/1999 | Shimizu et al. |
| 6,066,861 | A | 5/2000 | Hohn et al. |
| 6,068,383 | A | 5/2000 | Robertson et al. |
| 6,220,725 | B1 | 4/2001 | Arnold |
| 6,234,648 | B1 | 5/2001 | Borner et al. |
| 6,340,824 | B1 | 1/2002 | Komoto et al. |
| 6,351,069 | B1 | 2/2002 | Lowery et al. |
| 6,469,322 | B1 | 10/2002 | Srivastava et al. |

(Continued)

FOREIGN PATENT DOCUMENTS

EP    0 890 996 A2    1/1999

(Continued)

OTHER PUBLICATIONS

International Search and Written Opinion mailed May 11, 2009, for PCT/US2008/066075 filed by Xicato, Inc. (19 pgs).

(Continued)

*Primary Examiner* — Diane I Lee
*Assistant Examiner* — Jessica L McMillan
(74) *Attorney, Agent, or Firm* — Silicon Valley Patent Group LLP; Michael J. Halbert

(57) ABSTRACT

A solid state illumination device includes a semiconductor light emitter mounted on a base and surrounded by sidewalls, e.g., in a circular, elliptical, triangular, rectangular or other appropriate arrangement, to define a chamber. A top element, which may be reflective, may be coupled to the sidewalls to further define the chamber. The light produced by the semiconductor light emitter is emitted through the sidewalls of the chamber. The sidewalls and/or top element may include wavelength converting material, for example, as a plurality of dots on the surfaces. An adjustable wavelength converting element may be used within the chamber, with the adjustable wavelength converting element being configured to adjust the surface area that is exposed to the light emitted by the semiconductor light emitter in the chamber to alter an optical property of the chamber.

19 Claims, 19 Drawing Sheets

U.S. PATENT DOCUMENTS

| | | |
|---|---|---|
| 6,504,301 B1 | 1/2003 | Lowery |
| 6,576,930 B2 | 6/2003 | Reeh et al. |
| 6,586,882 B1 | 7/2003 | Harbers |
| 6,600,175 B1 | 7/2003 | Baretz et al. |
| 6,621,211 B1 | 9/2003 | Srivastava et al. |
| 6,649,946 B2 | 11/2003 | Bogner et al. |
| 6,680,569 B2 | 1/2004 | Mueller-Mach et al. |
| 6,724,142 B2 | 4/2004 | Ellens et al. |
| 6,765,237 B1 | 7/2004 | Doxsee et al. |
| 6,791,259 B1 | 9/2004 | Stokes et al. |
| 6,809,342 B2 * | 10/2004 | Harada ............ 257/79 |
| 6,850,002 B2 | 2/2005 | Danielson et al. |
| 7,250,715 B2 | 7/2007 | Mueller et al. |
| 7,479,662 B2 | 1/2009 | Soules et al. |
| 7,494,246 B2 | 2/2009 | Harbers |
| 7,534,002 B2 | 5/2009 | Yamaguchi et al. |
| 7,564,180 B2 | 7/2009 | Brandes |
| 7,614,759 B2 | 11/2009 | Negley |
| 2002/0043926 A1 | 4/2002 | Takahashi et al. |
| 2003/0201451 A1 | 10/2003 | Suchiro et al. |
| 2003/0230751 A1 | 12/2003 | Harada |
| 2004/0222433 A1 | 11/2004 | Mazzochette et al. |
| 2005/0057145 A1 | 3/2005 | Shieh et al. |
| 2005/0135098 A1 | 6/2005 | Currie et al. |
| 2006/0087487 A1 | 4/2006 | Ota |
| 2006/0109669 A1 | 5/2006 | Tanaka et al. |
| 2006/0126343 A1 | 6/2006 | Hsieh et al. |
| 2006/0164005 A1 | 7/2006 | Sun |
| 2007/0086211 A1 | 4/2007 | Beeson et al. |
| 2007/0120463 A1 | 5/2007 | Hayashi et al. |
| 2007/0263393 A1 | 11/2007 | Van De Ven |
| 2008/0142816 A1 | 6/2008 | Bierhuizen et al. |

FOREIGN PATENT DOCUMENTS

| | | |
|---|---|---|
| JP | 2005005546 | 6/2005 |
| WO | WO 00/17569 | 3/2000 |
| WO | WO 2007/000037 | 1/2007 |

OTHER PUBLICATIONS

Invitation and Communication Relating to the Results of the Partial International Search mailed Aug. 28, 2008, for PCT/US2008/066075 filed by Xicato, Inc. (8 pgs).

* cited by examiner

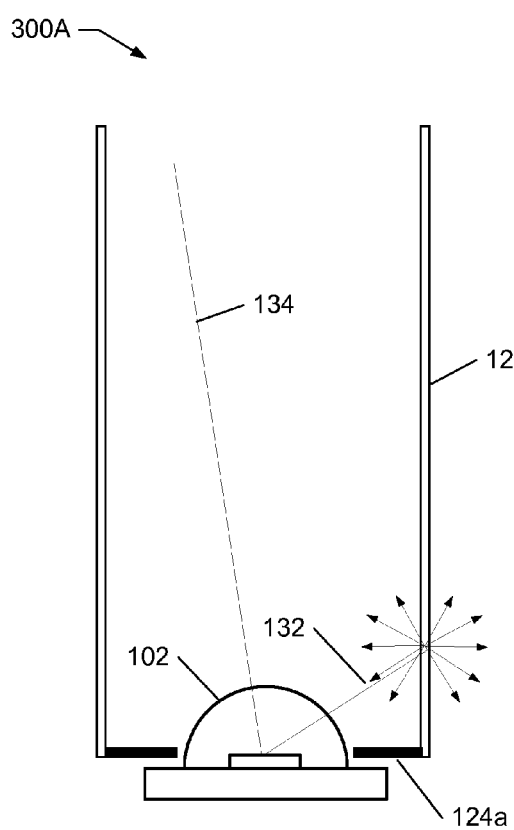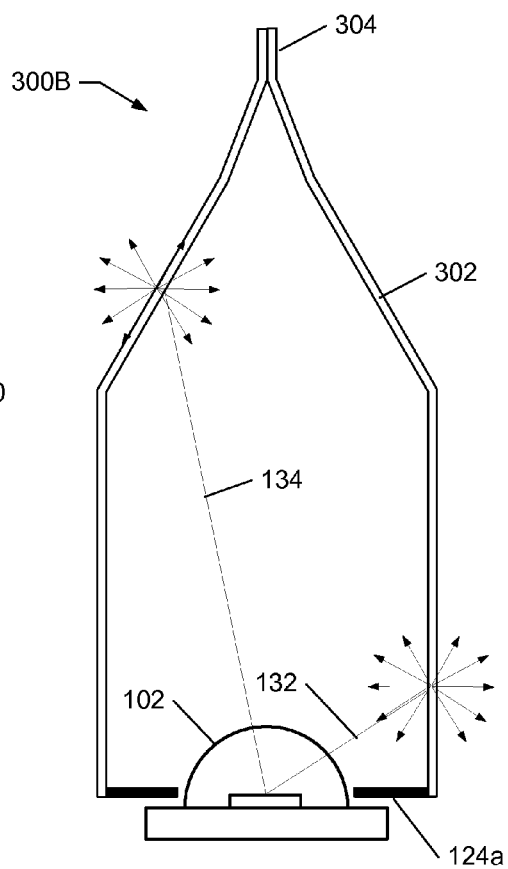
Fig. 8A　　　　　　　Fig. 8B
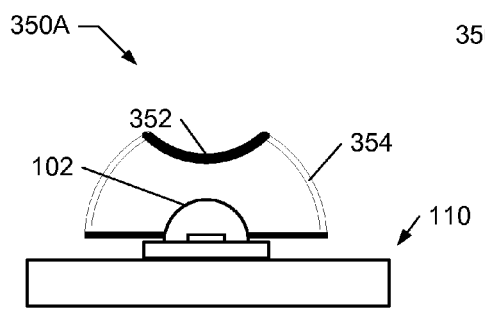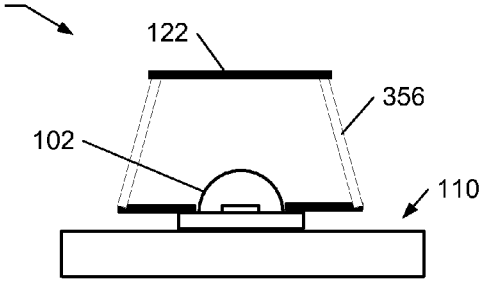
Fig. 9A　　　　　　　Fig. 9B

SOLID STATE ILLUMINATION DEVICE

FIELD OF THE INVENTION

The present invention relates to the field of general illumination, and more specifically, to illumination devices that use light sources as for example light emitting diodes (LEDs) or semiconductor lasers.

BACKGROUND

Solid state light sources are not yet frequently used for general illumination due to limitations in operating temperature, color rendering performance, color consistency, and efficiency. By way of example, solid state light sources with an input power range of 10 W to 40 W have a high operating temperature and accordingly require the use of relatively large heat spreaders and cooling structures. Moreover, LEDs have a limited spectral bandwidth, and thus, color rendering performance is limited due to only a limited number of efficient phosphors that have been found. Additionally, the use of phosphors in proximity to the LED limits the choice of phosphors due to temperature and chemical incompatibility. Color consistency is also problematic due to production tolerances in the wavelength conversion materials application process and variations in the wavelength conversion materials itself. Finally, compared to conventional gas discharge lamps, the cooling efficiency of conventional solid state light sources is low and, thus, large cooling structures are required.

The source of solid state light sources, e.g., LEDs and lasers, operate at low temperature (in the range of 60°-200° C.) relative the temperature of the sources in other types of lighting, e.g., the filament in an incandescent bulb, the cathodes in a gas discharge base fluorescent lamps, or the plasma in an high intensity discharge lamp. The high temperature of these conventional sources causes most of the heat generated by the lamp to radiate to ambient and spread out over a large area. The lower operating temperature of LEDs, which results in less heat radiating to ambient, renders it difficult to use LED lamps in existing lighting fixtures at same input power as conventional light sources because the LEDs require higher capacity cooling structures. Fortunately, in most cases, the input power of LED systems can be lower than that used for conventional light sources, as state of the art LEDs have become more efficient than incandescent lamps (in produced light output versus electrical power in), and soon will become more efficient than the gas discharge based conventional lamps, but cooling efficiency remains a factor in adopting solid state light sources.

The engineering and manufacturing investments required to overcome the challenges in solid state light source applications renders that the costs of solid state illumination installations high compared to that of conventional light source solutions. As a result, the introduction of an efficient and environmentally safe solid state illumination technology has been delayed. Accordingly, what is desired is an illumination device, which includes solutions to many of the drawbacks mentioned before, and which can be used and installed in the existing infrastructure.

SUMMARY

A solid state illumination device, in accordance with an embodiment of the present invention includes a semiconductor light emitter mounted on a base and surrounded by at least one sidewall. The base includes electrical connections for the semiconductor light emitter as well as a heat spreader that is thermally coupled to the semiconductor light emitter. A reflective top is coupled to the at least one sidewall such that a chamber is defined by the base, top and the at least one sidewall. At least 70% of light that is emitted from the chamber is emitted from the sidewalls of the chamber.

In another embodiment, a solid state illumination device includes a semiconductor light emitter mounted on a base and surrounded by at least one sidewall. A top is coupled to the at least one sidewall such that a chamber is defined by the top, base and the at least one sidewall. An adjustable wavelength converting element is coupled to the chamber and is configured to adjust a surface area that is exposed to light emitted by the semiconductor light emitter in the chamber to alter an optical property of the chamber, such as the color or intensity of the light output. In one embodiment, one of the top and the base includes an aperture through which the adjustable wavelength converting element is adjustably extended into the chamber. The adjustable wavelength converting element may be a rod with wavelength converting material coupled to the rod. In one embodiment, the rod includes an expandable portion that expands and constricts, e.g., to expand or constrict the length or the diameter.

In another embodiment, a solid state illumination device, in accordance with an embodiment of the present invention includes a semiconductor light emitter mounted on a base and surrounded by at least one sidewall. The base includes electrical connections for the semiconductor light emitter as well as a heat spreader that is thermally coupled to the semiconductor light emitter. The base and at least one sidewall define a chamber that has a height to diameter ratio is 2 or greater.

BRIEF DESCRIPTION OF THE DRAWINGS

FIGS. 8A and 8B show cross-sectional views of solid state illumination devices without a separate top element in accordance with another embodiment of the invention.

FIGS. 9A and 9B show alternative shapes for the sidewalls of the device.

DETAILED DESCRIPTION

Figure 1:
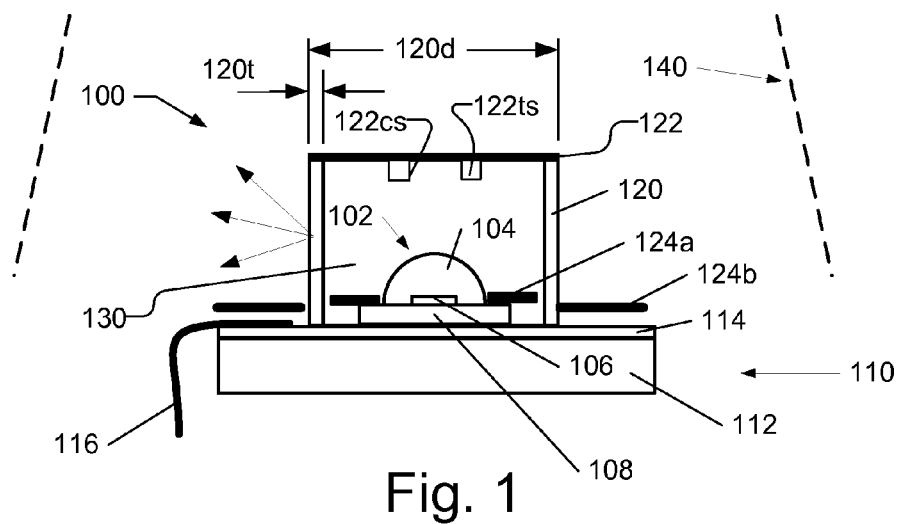
FIG. 1 shows a solid state illumination device with a semiconductor light emitter in accordance with an embodiment of the present invention.

FIG. 1 illustrates a side view of a solid state illumination device 100, in which at least one semiconductor light emitter 102, such as a light emitting diode (LED), is used. The semiconductor light emitter 102 is referred to herein as light emitting diode 102 or LED 102, interchangeably. In one embodiment, the LED 102 includes a lens 104, and may be produced by, e.g., Philips Lumileds Lighting LLC as the Luxeon Rebel or Luxeon K2. Other commercially available semiconductor light emitters can be used if desired, as for example, those produced by Nichia (Japan), Cree (USA), Osram (Germany), and Toyoda Gosei (Japan). Although semiconductor light emitters produced by these different manufacturers come in different forms sizes, and attachment methods, all can be made to fit into the illumination device 100 shown in FIG. 1.

Moreover, although the semiconductor light emitter 102 is shown with a lens 104, semiconductor light emitters without a lens can be used as well, as for example the Luxeon Flash LED, as produced by Philips Lumileds Lighting LLC, or the Ostar LED device, as produced by Osram. The Ostar device is an example of an LED where multiple dies are used in a package. The LED 102 typically, but not necessarily, consists of a light emitting element, called the LED die, or LED chip 106, and a chip carrier, called submount 108. If desired, multiple semiconductor light emitters may be used.

As illustrated in FIG. 1, the LED 102 is mounted on a base 110, which in this embodiment consists of a printed circuit board 114, and a heat spreader 112. In one embodiment, a metal core printed circuit board (MC-PCB) may be used, such as that manufactured by CIRE, Bree Industries. With some LEDs (as for example the Luxeon K2), it is possible to directly mount the LED 102 on heat spreader 112 (by gluing, or soldering, or using thermal paste or tape), and to connect the leads to a connection pads on a regular PCB (made for example of FR4 material), or directly solder wires to the LED leads. The heat spreader 112 may be manufactured by, e.g., Aavid Thermalloy, USA, or by ThermalFlo Inc. Typically heatsinks are extruded aluminum and may be e.g., so-called Radial Extrusions, which consist of a central core and radially placed fins. The heat sink 112 should have low thermal resistance, preferably below 10 K/W for LED powers up to 5 W and below 5 K/W for total LED input power up to 10 W, and below 2 K/W for total LED input power up to 25 W. The heat sink 112 may consist of multiple parts, and the parts can be of different shapes and sizes. The heat sink 112 may also be integrated with, or form the housing of a lighting fixture. In addition to the LED, the base 110 might contain other electronic parts (not shown), as for example a temperature sensor (e.g. NTC Thermistor), or an optical RGB sensor (as for example made by Hamamatsu (Japan), part number 510170). Furthermore, base 110 might contain an LED driver, as for example MAX16803 or MAX 16819, as made by Maxim (USA), and the components required in combination with these drivers. In addition the base 110 contains an electrical connection 116 to electrically connect the illumination device 100 to a power supply or to a socket.

The illumination device 100 includes at least one sidewall 120 that may have a circular, elliptical, triangular, rectangular, or polygon shape as viewed from the top and may be made of an optical transparent or translucent material, glass, plastic, and/or AlO2. The use of AlO2 as a material for the sidewall 120 is advantageous because of its high thermal conductivity, and high optical transmission properties. The AlO2 can be mixed into a plastic, but also used in pure form, as for example in a ceramic form (Alumina), or in crystalline form (Sapphire) For example, when the sidewall 120 has a circular or elliptical shape, a single continuous sidewall may be used. When a triangular, rectangular or other similar discontinuous shape is used, separate sidewall sections may be used, and for the sake of simplicity, the present disclosure will refer to sidewalls 120. In one embodiment, portions of the sidewalls 120 may be continuous, while other portions are discontinuous, e.g., to form a configuration having a "D" shape. In one embodiment, the sidewalls 120 may be produced from a plastic such as PC (poly carbonate), PMMA (acrylic), or Zeonex (made by Zeon Corporation, Japan), which can be mixed with metal oxide particles as for example $MgO_2$ or $AlO_2$ to make the material more scattering. The plastic and metal oxide particles can be injection molded or extruded. The thickness 120t of the sidewalls 120 may be in the range of, e.g., 0.1 to 3 mm. The diameter 120d of the sidewalls 120 depends on the size of the LED 102, or the number of LEDs used, but may be in the range of 3 to 13 mm.

The illumination device 100 may include a top element 122 that is made, e.g., of an optical material with a high reflection (preferably at least 80% reflective), and might be reflecting in a diffuse way, as for example obtained with a material made by Furukawa (Japan) called MC-PET, or might have specular reflecting properties as for example obtained with material made by Alanod (Germany), with the brand name Miro, or might have a combination of specular, and diffuse reflection. Several materials made by Alanod have a combination of diffuse and specular reflecting properties, or a diffuse effect can be created on a specular reflecting material by screen printing white dots on a mirror, and by varying the density and size of the dots. Screen printing the dots can be used to achieve a high efficiency or uniformity. Top element 122 may contain microstructures, to control the efficiency and uniformity. Additionally, top element 122 may contain electronic parts as well, as for example a color sensor 122*cs* (as for example made by Hamamatsu, Japan, part number S10170) or temperature sensor 122*ts* (NTC Thermistor). These electronic parts may be connected to the base 110 by thin electrical wires (not shown) running approximately in the middle of the chamber, 130 defined by the top element 122, sidewalls 120, and the base 110, and are preferably coated with a highly reflective white coating, or, might be coated with a wavelength converting material like phosphors.

The illumination device 100 may have reflective members 124*a* and/or 124*b*. As with the top element 122, the reflective members 124*a* and/or 124*b* may have a high optical reflection and low absorption, and have either specular and/or diffuse reflecting properties, and may contain microstructures to control the light distribution of the reflected light. To avoid blocking light from the LED 102 by the edges of the reflective members 124*a* and 124*b*, the reflective members 124*a* and 124*b* may be thin and closely fit around the emitting area of the LED 102. By way of example, the reflective members 124*a* and 124*b* from material manufactured by 3M (USA), such as Vikuiti Enhanced Specular Reflector (ESR film), which has a high reflectivity and has a thickness of about 65 micrometer and is flexible, which is useful to achieve a close fit around the LEDs without damaging the LEDs, or the LED lenses. Example of a thin diffuse reflecting material is E60L, which is made by Toray (Japan).

In one embodiment, the illumination device 100 may be used as a backlight, e.g., with red, green and blue LEDs 102 used, in combination with a feedback sensor 122*cs* and/or 122*ts* mounted on the top element 122.

Figures 2A, 2B:
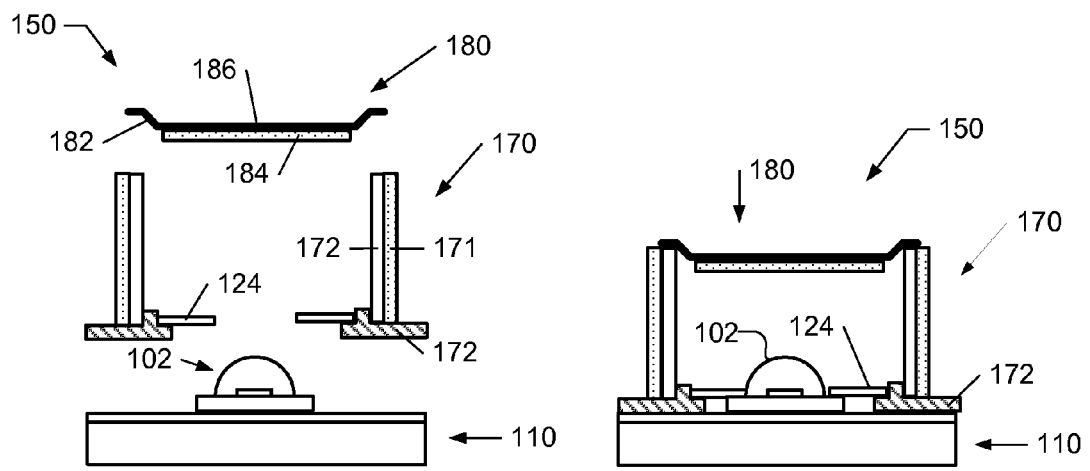
FIGS. 2A and 2B show side views of a solid state illumination device in various states of assembly.

FIGS. 2A and 2B illustrate side views of another embodiment of a solid state illumination device 150, which is similar to illumination device 100 shown in FIG. 1, like designated elements being the same. FIG. 2A illustrates the assembly of the illumination device 150 and FIG. 2B illustrates an illumination device 150 in an assembled form.

In this embodiment the reflector member 124 is attached to sidewall 170, using a mounting plate 172, which is designed to fit to the base 110 upon which is mounted the LED 102. The reflective member 124 in this embodiment may be made of a thin, flexible material such as Vikuiti Enhanced Specular Reflector (ESR film), as made by 3M, which has a high reflectivity and has a thickness of 65 micrometer, or E60L, as made by Toray (Japan), which is a highly diffuse white reflecting film, and has a thickness of 188 micrometer. By using a thin, flexible material for reflective member 124 damage of the LED 102 during mounting is avoided. Further, by using a very thin material, almost no light from the LED 102 (emitted parallel to the support structure 110) is blocked by the edge of the reflective member 124.

Figures 3A, 3B, 3C:
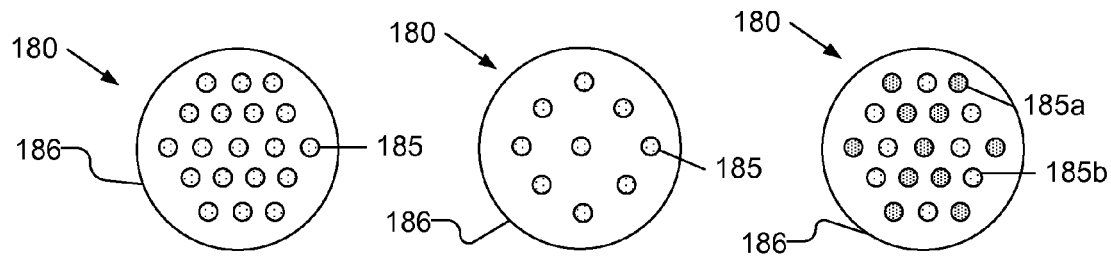
FIGS. 3A, 3B, and 3C show the wavelength conversion material on the top element of the device.

The top element 180 in this embodiment has an edge 182, which fits into the sidewall structure 170, and is fixed by either press fitting, gluing, click-fit, or screw-in assembly. If desired, the top element 180 may include a wavelength conversion layer 184 on a top reflector 186. The wavelength conversion layer 184 can be either a uniform layer, with the wavelength conversion material embedded in a binder, or may consist of dots on the top reflector 186, as shown in FIGS. 3A, 3B and 3C. The dots may be produced, e.g., by screen printing. The wavelength conversion layer 184 may include one or more phosphor material, such as an amber or a red light emitting phosphor, a combination of an amber and red light emitting phosphor, a yellow or green light emitting phosphor as well or combinations thereof.

One method of manufacturing the top element 180 with a wavelength conversion layer 184 is to screen print a large plate of this material, and stamp out the top elements with the desired shape. As illustrated in FIGS. 3A and 3B, the wavelength converting layer 184 may be formed on the top reflector 186 (or another material that is mounted on the top reflector 186) from a different numbers (and/or sizes) of dots 185 of a wavelength converting material. As illustrated in FIG. 3C, different wavelength converting materials may be used to form dots 185*a* and 185*b*. Alternatively, a mixture of wavelength converting materials may be used to form each dot, which provides a high degree of color point tunability, and improves the so called color rendering index, by creating a more continuous and flat spectrum. The dots 185 can be applied to the top reflector 186, for example, by screen printing, or ink-jet printing. While a relatively small number of dots are illustrated in FIGS. 3A-3C, it should be understood that in practice a large number of dots can be used with these techniques, which helps to get a uniform reflection from the top element 180.

The sidewall 170 include a transparent internal wall 132 attached to the mounting plate 172 and a wavelength conversion layer 171 mounted to the internal wall 172. The wavelength conversion layer 171 can be either a uniform layer, with the wavelength conversion material embedded in a binder, or may consist of a number of dots on the internal wall 172. If desired, the wavelength conversion layer 171 may be on the inside of the internal wall 172. The side wall can be either a single piece, with the phosphor embedded in a plastic material in the material which is extruded (like in the production of colored drinking straws), or the phosphor might be applied to the inside or outside of a transparent or translucent cylindrical carrier. If the phosphor is applied onto a 'carrier tube', the phosphor is preferably applied to the inside of the tube, to avoid damages to the phosphor layer. The outside of the tube is preferable made rough (by etching, or sanding, or grinding), or has a micro structure.

An important aspect of this embodiment is the ability to combine different top, side, and bottom sections, with different colors of the solid state light emitting device, and different wavelength converting combinations, wavelength converting layer thicknesses, wavelength converting concentrations, and/or different coverage factors for the side and top elements 13 and 12. Given the characteristics of the primary light emitter 11, and the requirements of the application, an appropriate sidewall 13 is chosen with known characteristics, as well as a top element 12, so that an illumination device is created with a color point, color rendering index, and spatial light output according to customer's demand as closely as possible. Different bottom sections can be used, with different solid state illumination emitters, which allows to switch suppliers depending on availability of primary light emitting devices 11, without having to change the specifications of the product, or, to use bulk of primary light emitting devices manufactured by a particular supplier, which vary in wavelength, light output, and/or forward voltage, by carefully selecting and combining the different emitters, side and top elements, given the target specifications of a device. This is for example done by using a computer model of the device, accessing a database of available parts.

Figure 4:
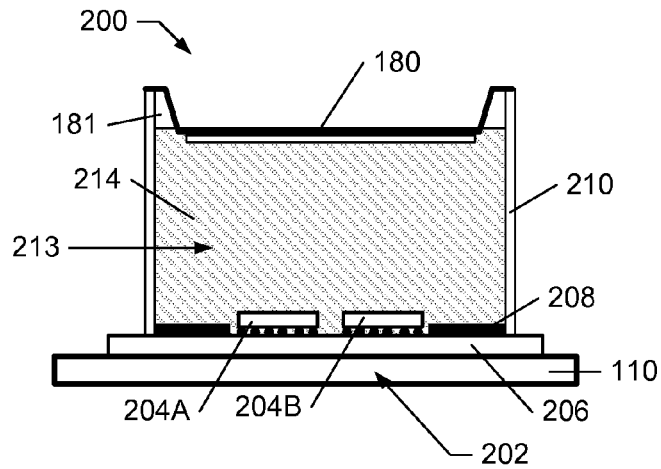
FIG. 4 shows a solid state illumination device with a semiconductor light emitter in accordance with another embodiment of the present invention.

FIG. 4 illustrates a side view of another embodiment of an illumination device 200, similar to illumination device 150, like designated elements being the same. Illumination device 200 includes multiple LEDs 202 in the form of an LED chips 204A and 204B mounted on a submount 206, a reflective member 208 attached to the submount 206 around the chip 204, sidewall section 210 placed around the chip 204 and the reflective member 208 and attached to the submount 206. If desired, more or fewer LEDs may be used. The top elements

180 may be configured similarly to that shown in FIG. 2A. The illumination device 200 contains a transparent optical material 214 within the chamber 213 defined by the submount 206 and the sidewall section 210. The transparent optical material 214 may be a silicone material, and may be a relatively soft or conforming silicone material, such as that produced by Dow Corning as model JCR6109, or JCR 6110 A/B Alternatively epoxies or any other transparent optical material can be used in place of a silicone material. The benefit of using a soft silicone material 214 is that it protects the LED chip 204 and avoids thermal or mechanical stress that can damage the LED chip 204 or any wire bonds leading to the chip. After applying the transparent optical material 214 into the chamber 213 formed by submount 206 and the sidewall 210, the top element 180 is connected to the sidewall 210, and the silicone may be cured, e.g., by thermal, UV curing, or other appropriate methods). As illustrated in FIG. 4, the top element 180 may include cavities 181 to allow the silicone in the chamber 213 to expand. This configuration has the benefit that the silicone 214 protects the LED chip 204, and it improves the extraction efficiency out of the chip 204 due to better refractive index matching. Moreover, illumination device 200 may have a compact configuration.

Figure 5:
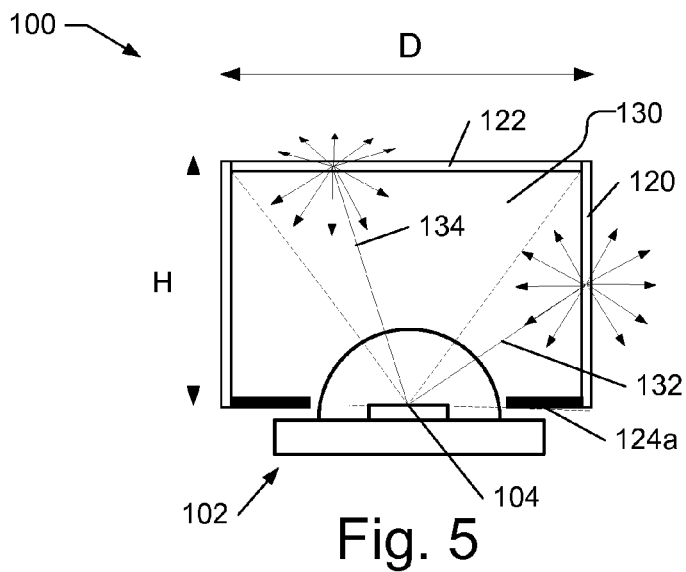
FIG. 5 shows a simplified view of a solid state illumination device.

FIG. 5 shows a simplified side view of the illumination device 100 from FIG. 1. FIG. 5 illustrates the optical properties of the illumination device 100 and does not show all components in the lighting device. As can be seen, the LED 102, which is the primary light source, emits light from the LED chip 104 both in the direction of the sidewall 120, as indicated by ray 132, and in the direction of the top element 122, as indicated by ray 134. Ray 132 hits the sidewall 120 and will be partially transmitted towards the desired target 140 shown in FIG. 1, and partially reflected, depending on the optical properties of the sidewall 120. The light reflected at the sidewall 120 will either hit the top element 122, or another part of the sidewall 120, or the bottom section (consisting of the reflective member 124*a* and the LED 102). Ultimately, at least 70% of the light emitted by the device 100 is emitted from the sidewall 120.

Another example of a light path in this device is indicated by ray 134. In this case, light from the LED 102 directly hits top element 122. As top element 122 is designed to have a high reflectivity, most of the light will be reflected from the top element 122. The light reflected from top element 122 will either hit the sidewall 120, or the reflective member 124*a*, or the LED 102.

Figure 17A:
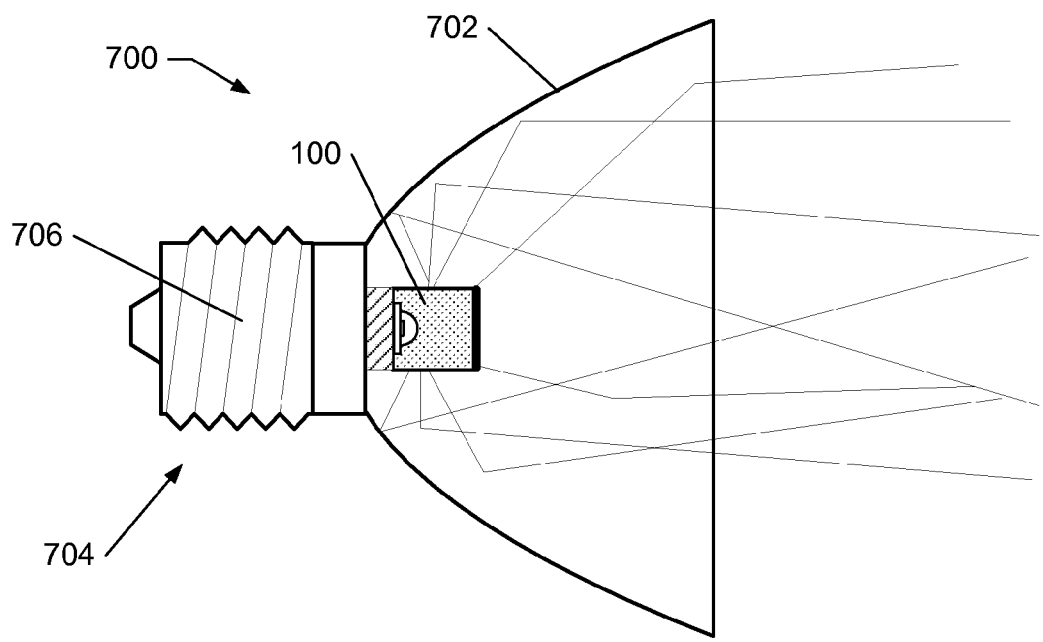
FIG. 17A shows an embodiment of a solid state illumination device used with a reflector element to form a reflector lamp.

The structure of illumination device 100 shown in FIG. 5 has many benefits for use in illumination applications, especially for use with light emitting diodes. First, most of the light exits the device through the sidewall, where it can easily be captured by a reflector in case of a reflector lamp as shown in FIGS. 17A, 18 and 22E, or further spread out as for example in a backlight configuration, as for example shown in FIGS. 19 and 20. Second, light from one or more primary light emitters is mixed within the chamber 130 formed by the top element 122, sidewall 120 and bottom section (consisting of reflective member 124*a* and LED 102). Mixing of the light in the chamber 130 is advantageous as LEDs can vary in color and intensity due to manufacturing tolerances. Further, different colors from different LED can be used in a package and the drive current of the individual LEDs can be varied to change the output color of the device. Third, the intensity profile of the illumination device 100 (the variation of intensity over angle) resembles the radiation pattern of a linear filament in an incandescent halogen bulb, so that existing optical design and manufacturing technologies can be used for development of fixtures based on the illumination device 100. Fourth, in an embodiment in which the sidewall 120 and/or top element 122 include wavelength converting materials, the configuration of the illumination device 100 allows for use of different top and sidewalls 122 and 120 with different phosphors, or different phosphor conversion factors, such that different color points can be achieved by substituting the side and or top elements. Fifth, as this cavity is preferably made of materials which have a (very) low absorption, the efficiency can be high, especially if this configuration is compared to the case where the wavelength converting layer is deposited on top of the LED chip, where a fraction of the light is directed back into the chip and partially absorbed. Sixth, in an embodiment in which the sidewall 120 and/or top element 122 include wavelength converting materials, and when the LED 102 produces a blue or UV pump light, the color or white point of the light output of the illumination device 100 is determined by components, e.g., sidewall 120 and top element 122 added in a late stage of the assembly process, after the wavelength and light output of the LED 102 is already measured or known. Thus, the wavelength converting materials and material concentrations and/or thickness of the side and top elements 122 and 120 can be chosen based on the measured or known wavelength and light output of the LED 102 to achieve the desired light output.

The luminance distribution over the output of the illumination device 100, i.e., along the sidewall 120 depends on the intensity profile of the primary light emitter(s), i.e., LED 102, and the optical and geometrical properties of the top element 122, the sidewall 120 and the reflective member 124*a* but may also depend on the number of LED chips used, and the position of the chips within cavity chamber. The height H of the sidewall 120 and the diameter D of the sidewall 120 are parameters in the optical design that affect the luminance distribution. In one embodiment, the ratio H/D may be 0.5 to 2.0.

Figure 6A:
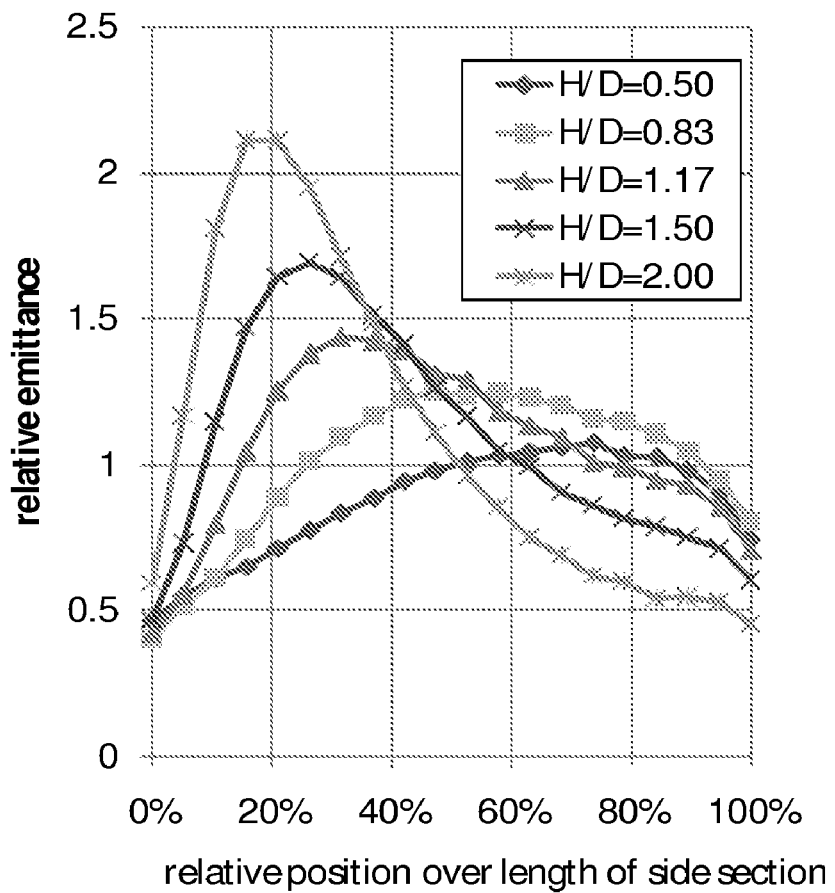
FIGS. 6A and 6B show the results of a simulation of the performance of a solid state illumination device and the efficiency of function of the height/diameter ratio.

FIG. 6A illustrates the variation of the emittance of the device as a function of the position over the height of the sidewall for different H/D ratios. In the simulation shown in FIG. 6A, the sidewall 120 has been given a transmission efficiency of 48%, and a reflection efficiency of 48%, and is given lambertian diffuse scattering properties similar to the properties of acrylic diffusers. A cylindrical shaped sidewall is used in the simulation, with a diameter of 12 mm. The top element is given a reflection coefficient of 98%, as achieved by using MC-PET material as made by Furakawa (Japan), and is simulated to be a diffuse reflective material.

The top element has a diameter of 12 mm as well. The reflective bottom member is given a reflection efficiency of 98% for the area outside the emitting area of the light source, and the emitting area of the light source is assumed to have a reflection coefficient of 0%. In practice the light source will have some reflection, but it will be low, and will vary with the different emitters chosen. In this case the emitting area is assumed to be a 3 mm diameter disk, corresponding to the approximate lens diameter of a Luxeon Rebel LED.

The results for the emittance as function of the position over the length of the cylindrical sidewall is given as function of the height to diameter ratio of the cylindrical cavity in FIG. 6A. Five curves are shown, with H/D ratios of 0.5, 0.83, 1.17, 1.50, and 2.0, corresponding to heights of 6 mm, 10 mm, 14 mm, 18 mm, and 24 mm for the actual lengths of a 12 mm cylindrical cavity. At low H/D ratios an emittance with relatively high uniformity is achieved, while for higher H/D ratios the uniformity decreases.

Figure 6B:
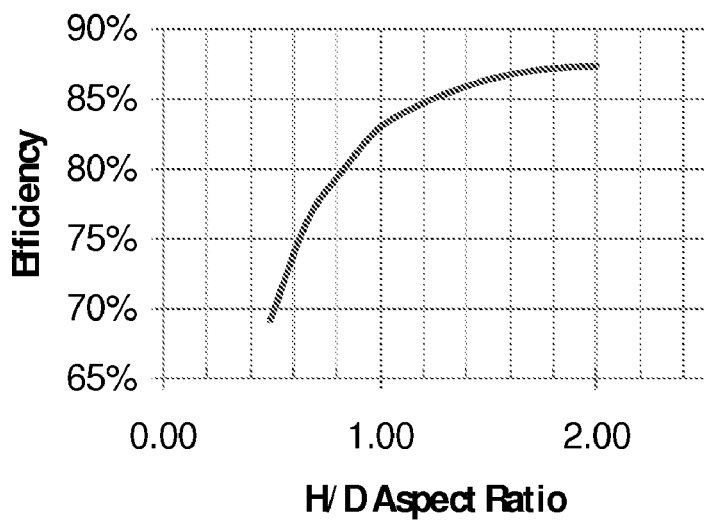

FIG. 6B shows the efficiency as a function of the H/D ratio with the same optical parameters of the device simulated in FIG. 6A. Efficiency is the light exiting from the side walls towards the target divided by light generated by the chips. Normally light would be measured in terms of lumens. If a wavelength converter is used, radiometric power needs to be used to define efficiency, but in that case the efficiency will be lower than shown in the graph due to the so-called Stokes shift, which basically is the difference in energy between a wavelength converted photon, and a (higher energy) blue or UV photon. In case of phosphor conversion, the efficiency as shown in the graph has to be decreased by an addition 15 to 25%. For low H/D ratios efficiency is relatively low, due to the amount of light scattered back towards the bottom section, which was assumed to have low reflection efficiency due to the absorption in the light source. For large H/D ratios efficiency reaches almost a value of 90%, and a value of 85% at a H/D factor of 1.25. In practice, an acceptable uniformity over the output area and (total) efficiency can be achieved through a judicious choice of the H/D ratio. Favorable H/D ratios are in the range of 0.5 to 2, and in particular a range of 0.8 to 1.6.

Figure 7A:
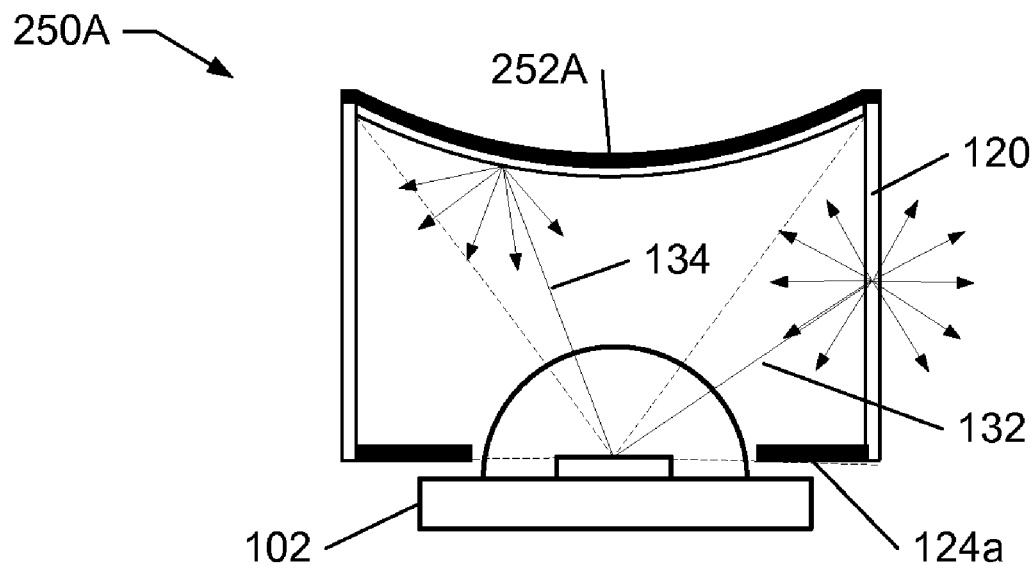
FIGS. 7A and 7B shows additional embodiments of solid state illumination devices.
Figure 7B:
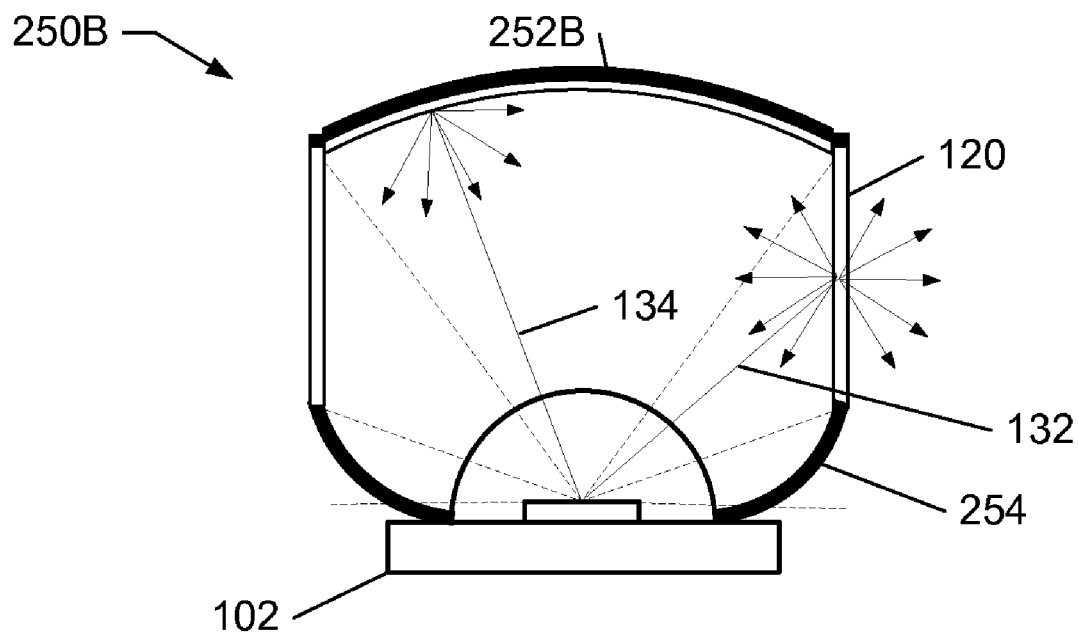

FIGS. 7A and 7B illustrate two respective embodiments of a solid state illumination device 250A and 250B (collectively sometimes referred to herein as illumination device 250). Illumination device 250 is similar to illumination device 100 illustrated in FIGS. 1 and 5, like designated elements being the same. Moreover, only a portion of illumination device 250 is illustrated in FIGS. 7A and 7B. The illumination device 250 includes features that can be used to further improve the efficiency and color uniformity. In FIG. 7A the top element 252A is made concave, i.e., bending inwards towards the LED 102. The concave top element 252A has the effect that light reflected at the top element is directed towards the sidewall 120, and less light is directed back towards the primary light source, and thus less light is absorbed by the light source. The shape of the top element 252A can be varied as necessary to achieve a high efficiency and/or high uniformity of the light output, and may include aspherical shapes or conical shapes. If desired, the top element 252A may have a convex shape as opposed to a concave shape. The optimum shape for a particular geometry can easily determined by using commercially available ray trace programs like for example ASAP, as produced by Breault Research organization, or LightTools, as produced by Optical Research Associates.

FIG. 7B illustrates an illumination device 250B with a convex top element 252B and a reflective member 254 with an elliptical or parabolic shape. If desired, a concave top element 252A may be used with the illumination device 250B. The curved reflective member 254 has the effect that more light from the primary light emitter 102 is directed to the top element 252B, and less directly to the sidewall 120. Directing more light to the top element 252B maybe useful to control the color of the output light of the device 250B, when the top element 252B contains a different color wavelength converter than the sidewall 120. In one embodiment, the top element 252B has a red light emitting phosphor layer, and the sidewall has a green emitting phosphor layer. By using an elliptical reflector member 254 instead of a flat reflector member 124a, more light from the primary light emitter 102 is directed to the top element 252B, and more light is converted to a red light, which will resulting in the light output having a lower correlated color temperature. The shape of the reflective member 254 also can be used to improve the uniformity of the sidewall emission, by directing the large angle emitted light towards the top segment of the sidewall 120.

FIGS. 8A and 8B show cross-sectional views of respective illumination devices 300A and 300B (collectively referred to herein as illumination device 300). Illumination device 300 is similar to illumination device 100, shown in FIGS. 1 and 5, like designated elements being the same, but illumination device 300 does not include a separate top element. Illumination device 300 is particularly useful when using a large H/D ratio, as for example shown in FIG. 8A. Most of the light from primary light emitter 102 is incident on the sidewall 120 directly (as illustrated by ray 132, and only a small portion of the light escapes toward the top of the device (as illustrated by ray 134). In on embodiment, the illumination device 300 has an H/D ratio that is 2.0 or larger, and preferably 3.0 or larger. FIG. 8B illustrates a configuration of an illumination device 300B in which the sidewall 302 is brought together to form the top element 304. Illumination device 300B is advantageous as relatively inexpensive extrusion methods can be used to produce the sidewall 302. Sidewall 302 may be closed to form the top 304 by clamping, gluing, thermal forming, or other appropriate technique.

FIGS. 9A and 9B show cross-sectional views of respective illumination devices 350A and 350B (collectively referred to herein as illumination device 350). Illumination device 300 is similar to illumination device 100, shown in FIGS. 1 and 5, like designated elements being the same, but illumination device 350 includes differently shaped sidewall. As illustrated in FIG. 9A both the top element 352 and the sidewall 354 are curved, which results in more light being emitted upwards, i.e., away from the base 110 through the sidewall 354. This can be beneficial, e.g., in applications where the illumination device 350A is located relatively low in a light application, and the light application expects to receive light in a higher location. In FIG. 9B a similar effect is obtained, but now using a straight sidewall 356.

Both the sidewall shapes 354 and 356 in FIGS. 9A and 9B are preferably produced by injection molding, where the wavelength converter is deposited by spray painting, or where the phosphor is dispensed in the plastic. In case of spray painting, a lacquer can be used as a binder, and a total layer thickness in the range of 5 to 50 micrometer is applied to the sidewall section. Examples of plastic materials suited for injection molding the sidewalls includes PMMA, or Zeonex.

Figure 10A:
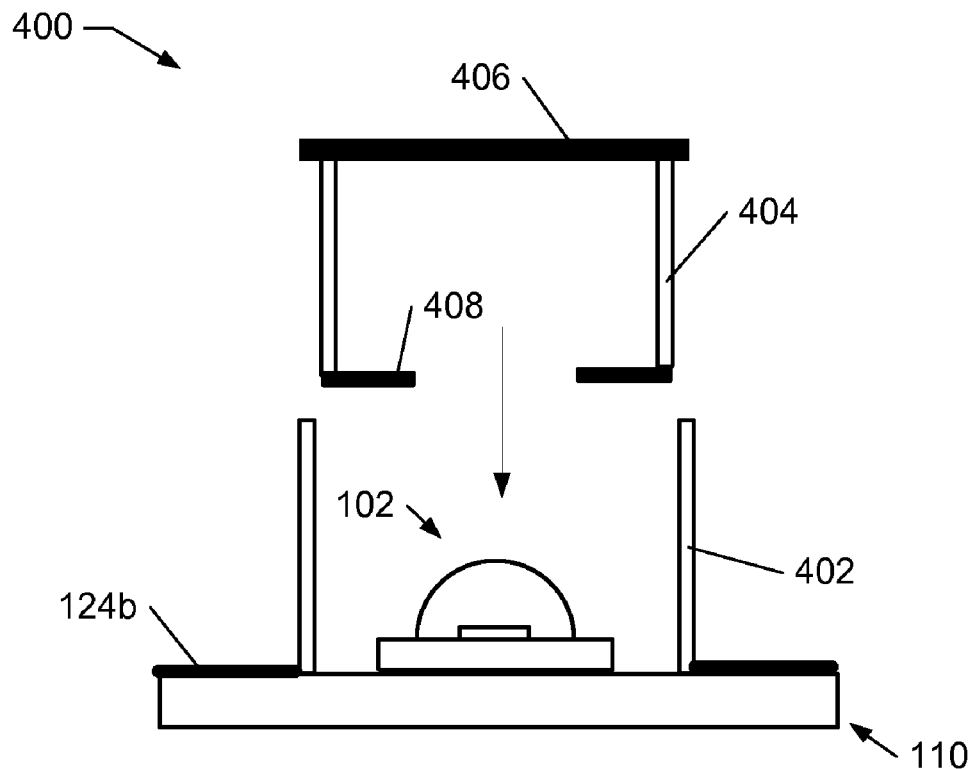
FIGS. 10A and 10B show side views of another embodiment of a solid state illumination device in various states of assembly.
Figure 10B:
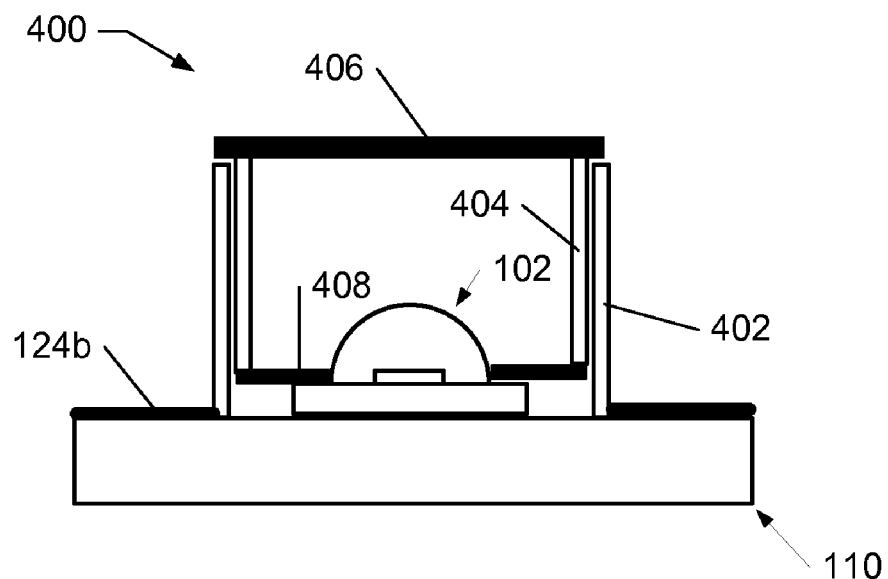

FIGS. 10A and 10B show cross-sectional views of another embodiment of an illumination device 400 in an unassembled and an assembled state. Illumination device 400 is similar to illumination device 100, shown in FIG. 1, like designated elements being the same. Illumination device 400 includes a bottom section 110 to which is attached an exterior sidewall 402. A top element 406 is attached to an interior second sidewall 404. The reflective member 408 is attached to the interior sidewall 404. As illustrated the illumination device 400 is assembled by inserting the interior sidewall 404 into the exterior sidewall 402. The benefit of this configuration is that high color uniformity is achieved, and that different colors or white points can be achieved by using top elements with different wavelength converters, or wavelength conversion efficiencies. As an alternative to this embodiment, the reflective member 408 may be attached to the bottom section 110, and the exterior sidewall 402 is attached to the top element 406 and the interior sidewall 404 is attached to the bottom section 110. If desired, the interior sidewall 404 may not cover the entirety of the exterior sidewall 402 (or vice-versa), for example in the case where the device is used in a reflector lamp, and an illumination pattern is desired where the outside of the beam has a different color or intensity than the center of the beam.

Figure 11A:
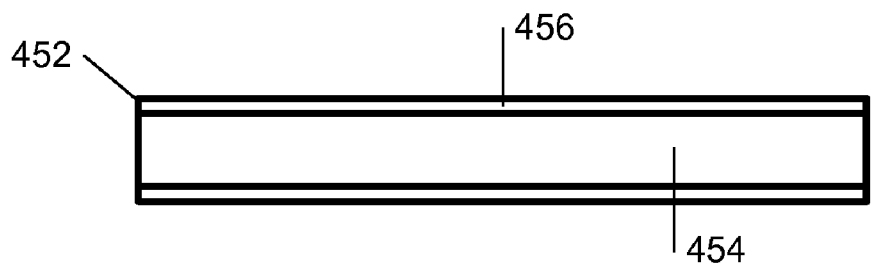
FIGS. 11A, 11B, and 11C show an adjustable wavelength converting element and the operation of the adjustment wavelength converting element with a solid state illumination device in accordance with another embodiment of the present invention.
Figure 11B:
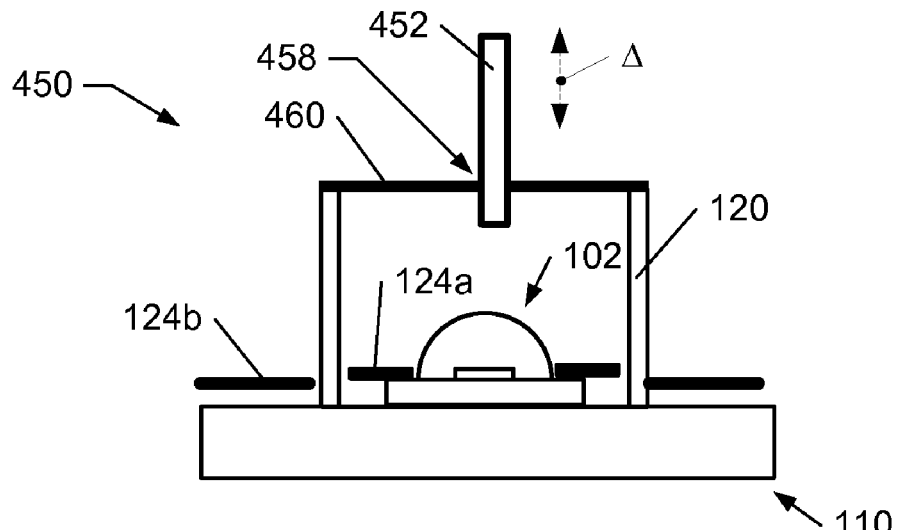
Figure 11C:
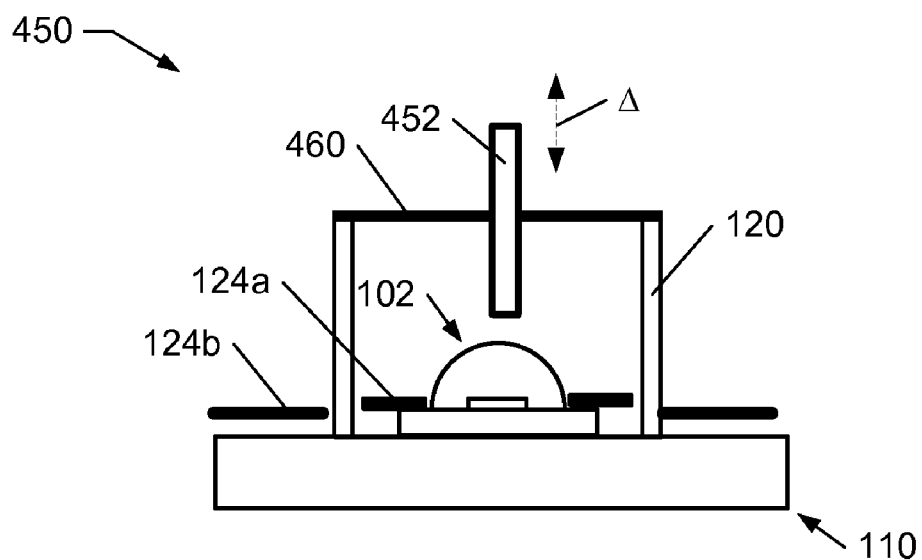

FIGS. 11A, 11B, 11C illustrate an adjustable wavelength converting element 452 and using the adjustable wavelength converting element with an illumination device 450 in accordance with another embodiment. The illumination device is similar to illumination device 100, shown in FIG. 1, like designated elements being the same. The adjustable wavelength converting element 452 shown in FIG. 11A is a member 454, such as a metal or plastic rod or wire, that is coated with a layer 456 of wavelength conversion material or dye. The adjustable wavelength converting element 452 need not be solid, but may be a hollow tube and instead of being coated with wavelength conversion material or dye, it may at least partially contain the wavelength conversion material or dye. In one implementation of this embodiment, the light source 102 is a cool white (i.e. a white with a correlated color temperature higher than 5000 K) high power LED, as for example a Luxeon K2 (as manufactured by Philips Lumileds Lighting), and the adjusting element is made of metal wire coated with a red or amber light emitting phosphor. The sidewall 120 in this case consists of a translucent material. As illustrated by FIGS. 11B and 11C, the adjustable wavelength converting element 452 is brought into the device 450 through an aperture 458 in the top element 460 and can be held at different positions along an adjustment range A. If desired, the LED may be operated at the required drive current while the light output of the device is monitored with a color point meter. By inserting the adjustable wavelength converting element 452 farther into the device 450, the correlated color temperature is reduced. The adjustable wavelength converting element 452 may be inserted farther into the device 450 until the desired color point is achieved, and then fixed to the top element 460 by, e.g., gluing, or soldering, or laser welding, or other mechanical methods to fix two parts. The portion of the adjustable wavelength converting element that is external to the device 450 may then be removed, e.g., by cutting.

In another example, the sidewall 120 may include a YAG phosphor, and a blue LED 102 may be used with an adjustable wavelength converting element 452 that includes a red or amber light emitting phosphor layer 456. The benefit of this embodiment is that a higher efficiency can be obtained as the YAG phosphor combines the function of wavelength converter and diffuser. Light produced by the YAG phosphor is far from the blue emitter, which is partially absorbing the light generated by the phosphor, and thus less light is absorbed by the LED 102 as in the case where the phosphor is in close proximity of the light emitter.

Figure 12A:
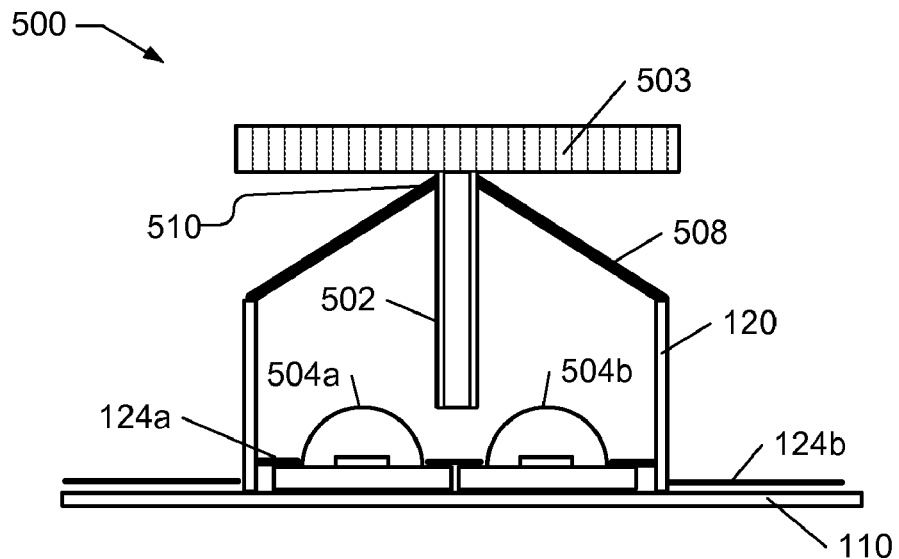
FIGS. 12A and 12B show an embodiment of an adjustable wavelength converting element that is manually adjustable.
Figure 12B:
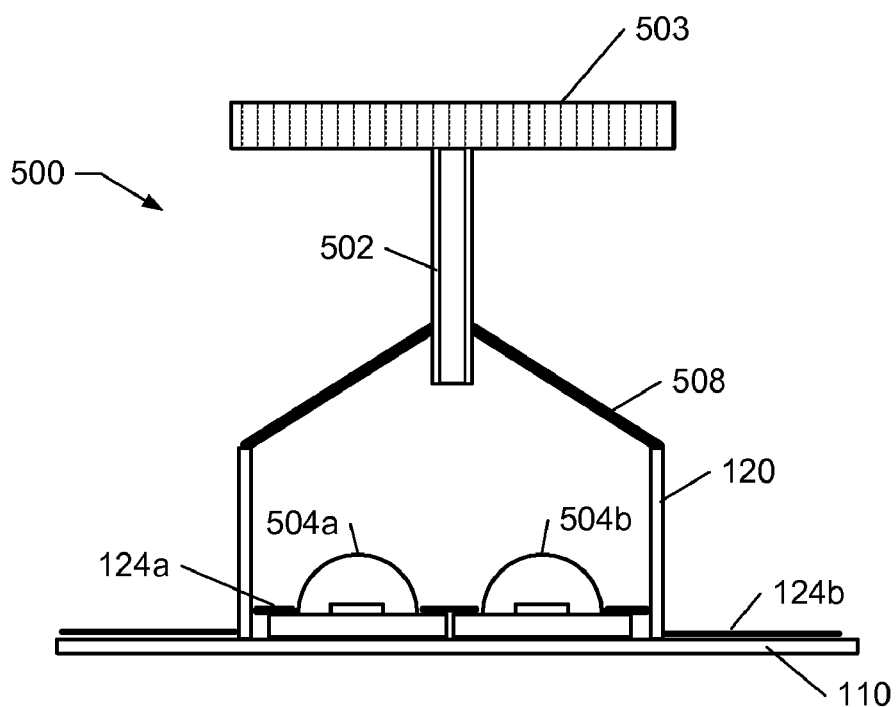

FIGS. 12A and 12B illustrate another embodiment of an illumination device 500 in which an adjustable wavelength converting element 502 is inserted into the illumination device 500 from the top. The adjustable wavelength converting element 502 is formed from a screw that is coated with, e.g., a red or amber light emitting phosphor. By way of example, the coating may be produced by mixing the phosphor in a UV curable lacquer, and dip-coating a regular (metal) screw into the lacquer, and curing the lacquer with a UV lamp while rotating the screw in a horizontal position. The use of an adjustable wavelength converting element with a screw configuration is advantageous as light is better spread out over the sidewall of the device. In FIG. 12A the adjustable wavelength converting element 502 is shown fully inserted into the illumination device 500, and thus, there is a maximal contribution of the light conversion material on the screw. FIG. 12B, on the other hand, illustrates the adjustable wavelength converting element 502 in its highest position, and thus, there is only a minimal effect of the light conversion material associated with adjusting element 502 to the light output of device 500. One advantage of the screw-type adjusting element is that the color point can be changed by the user of the device, and that a precise control can be achieved. Illumination device 500 illustrates the use of multiple primary light emitters 504a and 504b, which are mounted on the bottom section 110 of the illumination device 500. The top element 508 is a reflective arch and includes a threaded aperture 510 through which the adjustable wavelength converting element 502 is inserted. The use of a reflective arch for the top element 508 provides a better spread of light over the sidewalls of the device 500 and more light is directed to the adjusting element 502, particularly when multiple light sources are used. If desired, a flat top reflector, or concave or convex top elements may be used. The adjustable wavelength converting element 502 in FIGS. 12A and 12B is illustrated with a relatively large head 503 so that the depth of the screw can be adjusted by hand. In other embodiments, the adjustable wavelength converting element 502 may require a screw driver to adjust the depth of the screw, which may be preferable when the adjustable wavelength converting element 502 is hot.

Figure 13A:
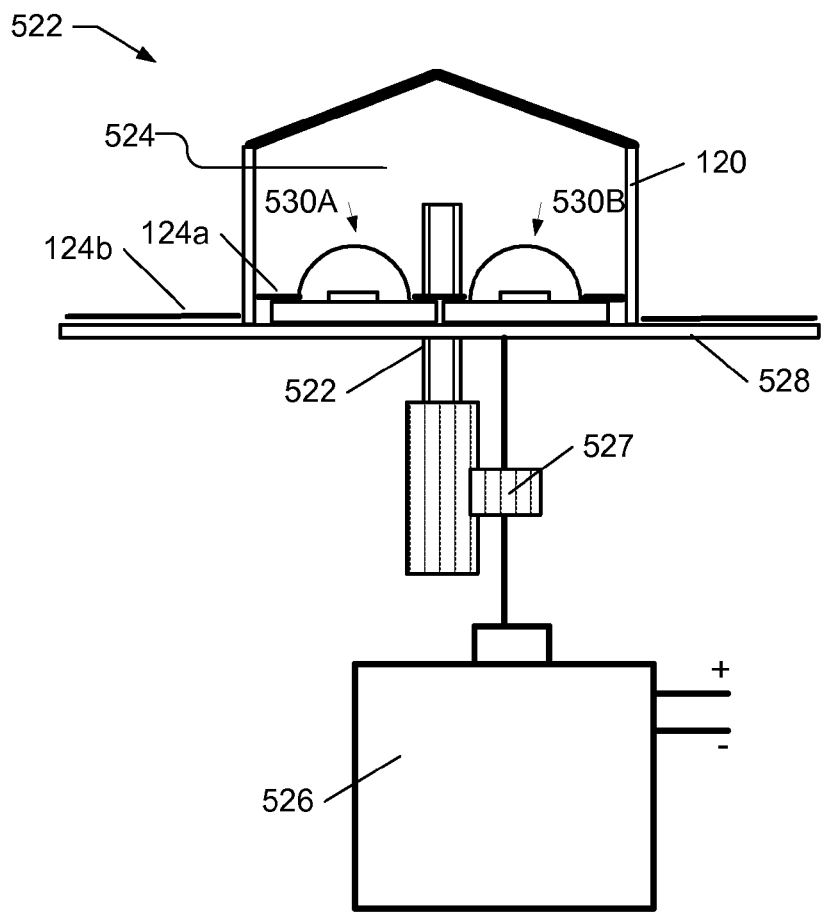
FIGS. 13A and 13B show an embodiment of an adjustable wavelength converting element that is adjustable by an actuator.
Figure 13B:
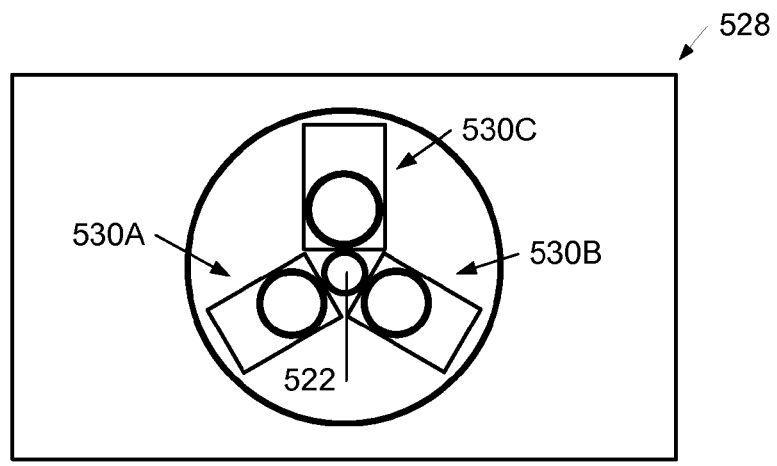

FIGS. 13A and 13B illustrate a side view and a top view of another embodiment of an illumination device 520 that uses an adjustable wavelength converting element 522, which is moved in or out of the chamber 524 of the device 520 with a motor 526. The adjustable wavelength converting element 522 may be have a screw configuration and maybe coated with, e.g., a red or amber light emitting phosphor. The adjustable wavelength converting element 522 is brought into the chamber 524 through the bottom section 528, which in this case has three primary light emitters 530A, 530B, and 530C, which may be, e.g., the Luxeon Rebel type. The adjustable wavelength converting element 522 is connected to the motor 526 with a gear system 527. Of course, different types of motors may be used, such as stepper motors.

FIG. 13B illustrates a top view of the bottom section 528 with three LEDs 530A, 530B, and 530C. The three LEDs are each 120 degrees rotated compared to its neighbor. Preferably Luxeon Rebel LEDs are used in such a configuration. The adjustable wavelength converting element 522 is brought in through the center between the three LEDs.

Figure 14A:
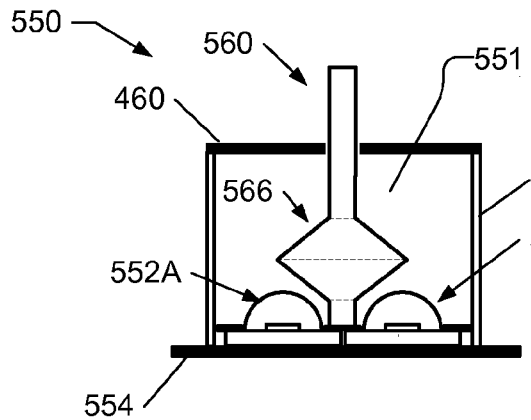
FIGS. 14A, 14B, 14C, 14D, and 14E show alternative embodiments of an adjustable wavelength converting element.
Figure 14B:
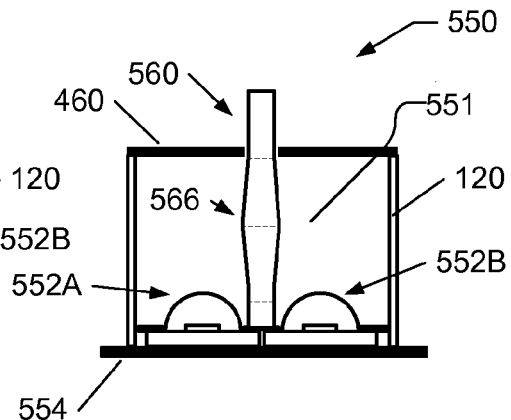
Figure 14C:
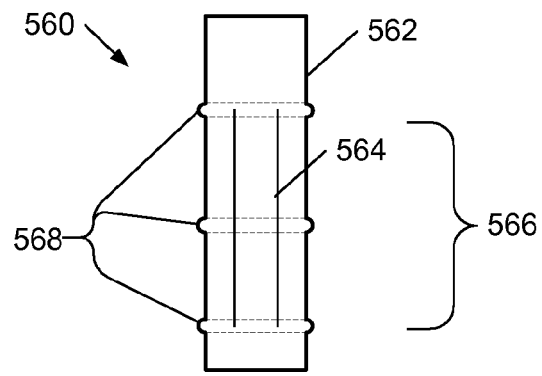

FIGS. 14A to 14E illustrate additional embodiments of adjustable wavelength converting elements that may be used with illumination device 550. The illumination device 550 is similar to illumination device 450 shown in FIGS. 11B and 11C, but includes multiple primary light emitters 552A and 552B mounted on the bottom section 554. FIGS. 14A, 14B, and 14C illustrate an adjustable wavelength converting element 560 that is made of a flexible tube 562 that is coated with or embedded with a wavelength converting material and includes multiple slits 564 along the length of a segment 566 of the tube 562 that is positioned approximately in the middle of the chamber 551 of the illumination device 550.

The tube 562 is fixed to the bottom section 110 of the device, e.g., by gluing or clamping, and the segment 566 with the cuts 564 is configured to expand when the tube 562 is pushed from the top. In FIG. 14A the configuration is shown where the segment 566 is expanded, and in FIG. 14B the configuration is shown with segment 566 contracted. FIG. 14C shows a detail of segment 566, with the cuts 564 shown in a vertical direction, i.e., along the length of the segment 566. Tube 562 may also include preformed sections 568 at the top, middle, and bottom, of the segment 566 to facilitate easy bending. When the segment 566 is expanded, a larger area of the tube 562 is exposed to the light from the light sources 522A and 522B as compared to when the segment 566 is in contracted form. The light output of the illumination device 550 can thus be varied by altering the expansion of the segment 566. By way of example, if the tube 560 has a red or amber light emitting phosphor, and the sidewall section 120 has a yellow or green light emitting phosphor, a high correlated color temperature is achieved while the segment 566 is in contracted form (shown in FIG. 14B), and a low correlated temperature is achieved while the segment 566 is in expanded form (as shown in FIG. 14A), while maintaining a high color rendering index.

In another embodiment, the adjustable wavelength converting element 560 could be made, e.g., by a silicone cylinder, attached to the bottom section 110 of the device 550, and to a control stick on the top. By pushing the stick downward, the silicone can be made to transform from a cylinder shape, into a more elliptical shape, with the same effect as described above. The silicone adjustable wavelength converting element 560 would contain a spectral modification material, for example a phosphor.

Figure 14D:
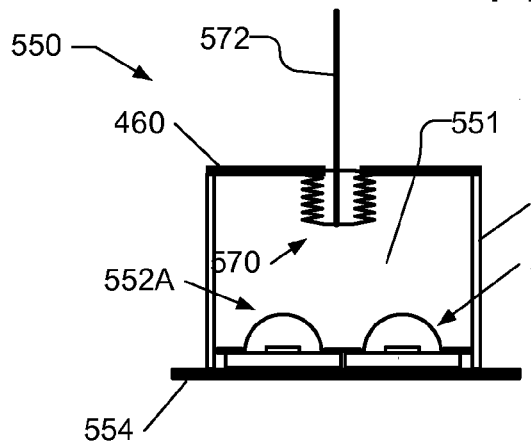
Figure 14E:
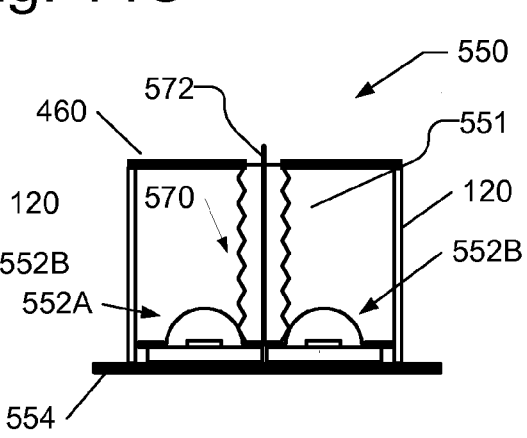

In another configuration, as shown in FIGS. 14D and 14E, an adjustable wavelength converting element 570 is formed from a corrugated tube, with the tube loaded with a dye or phosphor. Such corrugated parts are for example used in drinking straws to bend the top portion of the straw. In this embodiment, the expansion of the adjustable wavelength converting element 570 expands the tube from a very short length as illustrated in FIG. 14D, to a long length as shown in FIG. 14E. A control stick 572 extends through the tube and is coupled to the bottom of the tube to control the amount of expansion of the adjustable wavelength converting element 570.

Figure 15A:
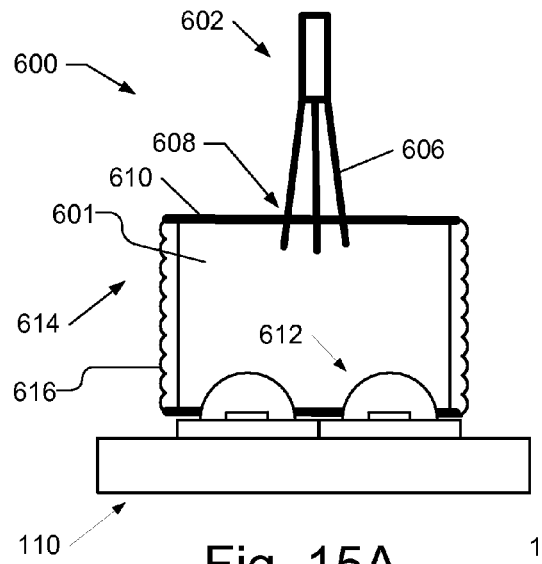
FIGS. 15A, 15B, 15C, and 15D show alternative embodiments of an adjustable wavelength converting element.
Figure 15B:
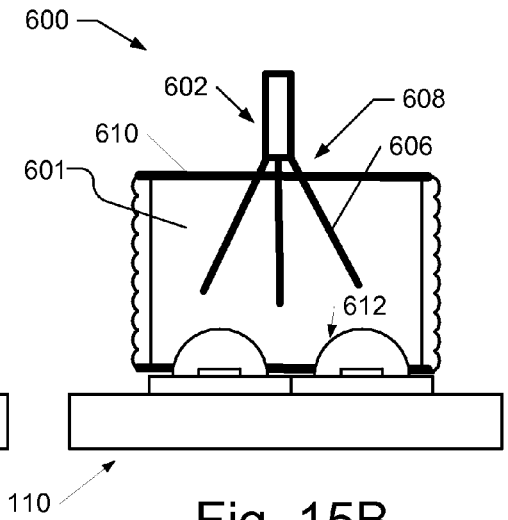

FIGS. 15A and 15B illustrate another embodiment of an adjustable wavelength converting element 602 that may be used with illumination device 600. The illumination device 600 is similar to illumination device 550 shown in FIG. 14A to 14E, like designated elements being the same. In FIGS. 15A and 15B, the adjustable wavelength converting element 602 is a tube coated or embedded with a wavelength converting material, such as phosphor. The end of the tube 602 is split over a length, e.g., approximately the height of the chamber 601 of the device 600 into two or more ends 606. The ends 606 are brought into separate holes 608 in the top element 610. The holes 608 are located, e.g., on a circle that is centered with the tube 604, and the diameter of this circle is larger than the diameter of the adjustable wavelength converting element 602. When the adjustable wavelength converting element 602 is inserted further into the device 600 the ends 606 will spread, as illustrated in FIG. 15B, and accordingly, will be more exposed to the light of the LEDs 612, than when the adjustable wavelength converting element 602 is more withdrawn from the device 600 as illustrated in FIG. 15A. In one embodiment white LEDs with a high correlated color temperature are used (for example 6500K). In one embodiment, a large number, e.g., 3, 6, 9, 12 or 15, CCT white LEDs may be used with the sidewalls 614 having an optical micro structure 616 to control the intensity profile coming out of the device. The microstructure 616 can for example be a BEF film, as produced by 3M. The lens shapes of primary light emitters 612 can be optimized to make the light distribution over sidewall 614 more uniform.

Figure 15C:
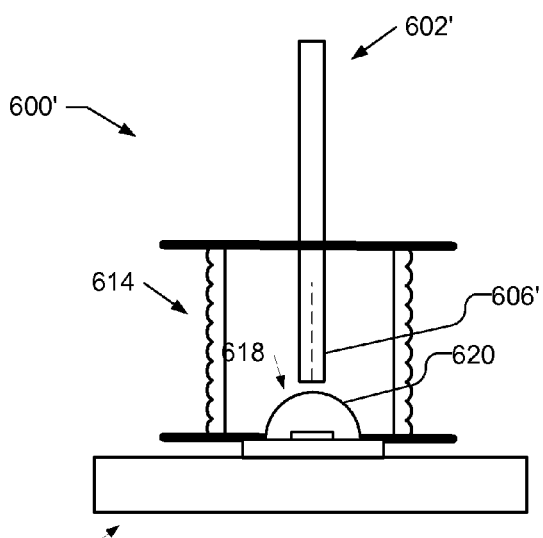
Figure 15D:
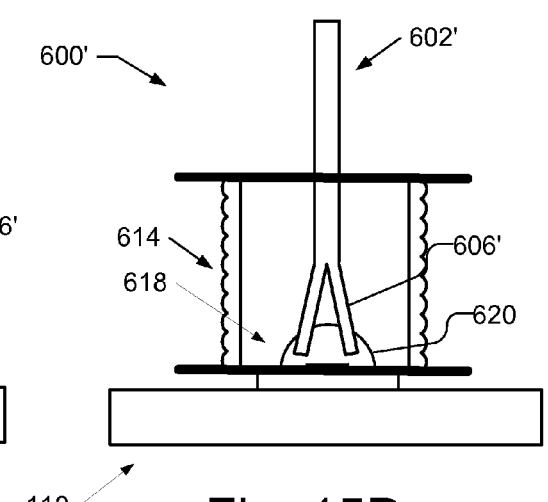

FIGS. 15C and 15D show another configuration of the illumination device 600' with an adjustable wavelength converting element 602' having ends 606' that are brought close to the primary emitter 618, and where the ends 606' cover the lens 620 of the primary emitter 618 when the adjustable wavelength converting element 602' is lowered into the illumination device 600'. If desired, the adjustable wavelength converting element 602' may have a larger diameter than the diameter of the lens 620, in which case a hollow adjustable wavelength converting element 602' need not be split. For example, the adjustable wavelength converting element 602' can be a tube with dye or phosphor, and has a single (cylindrical) end, covering the lens in lowest position.

Figure 16A:
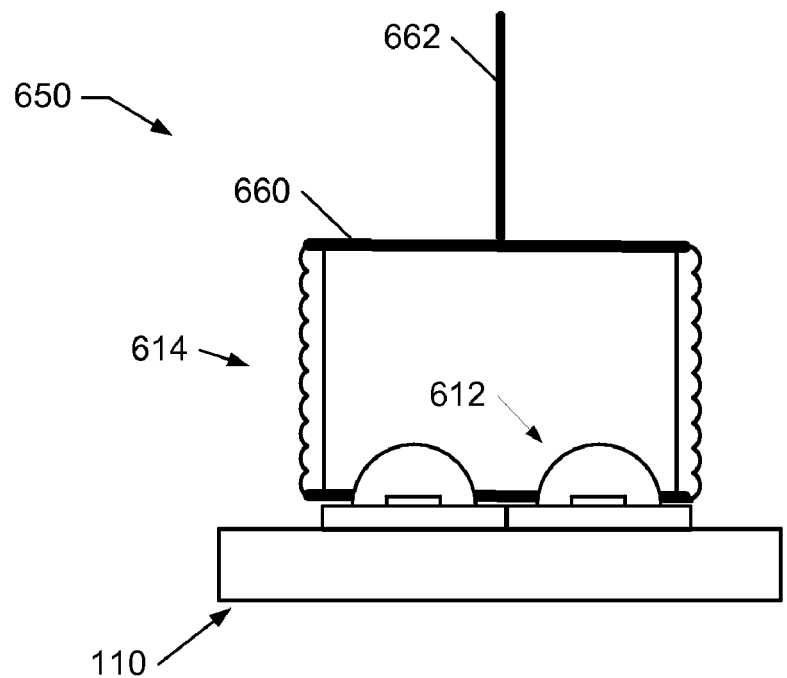
FIGS. 16A and 16B show an alternative embodiment in which the top element is the adjustable wavelength converting element.
Figure 16B:
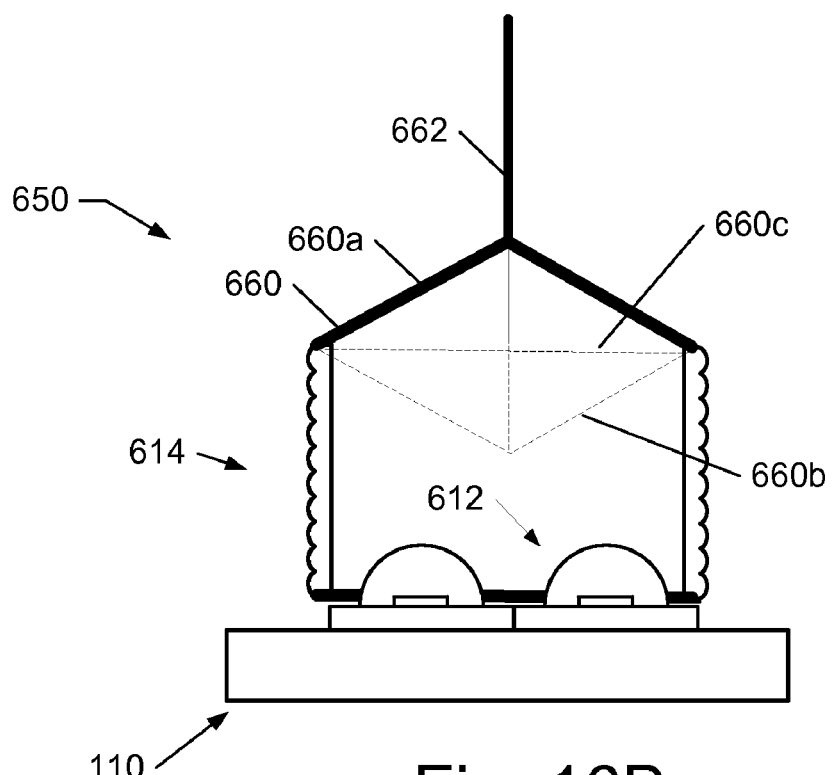

FIGS. 16A and 16B illustrate another embodiment of an illumination device 650 with an adjustable wavelength converting element produced by the top element 660, which is made of a flexible material, as for example rubber, or silicone. In this case the flexible material contains a dye or wavelength converting material, either applied to its surface, or embedded in the material. An arm 662 may be coupled to the top element 660, e.g., in the middle. By pulling or pushing the arm 662, the top element 660 changes shape, e.g., from a concave roof type shape, illustrated in FIG. 16B by lines 660a to a convex inverted roof type shape, illustrated by lines 660b, or somewhere in the middle, illustrated by lines 660c. By changing the shape of top element 660, the optical properties of the emission through the sidewall will change, and can be used to tune the optical properties as desired.

Figure 17B:
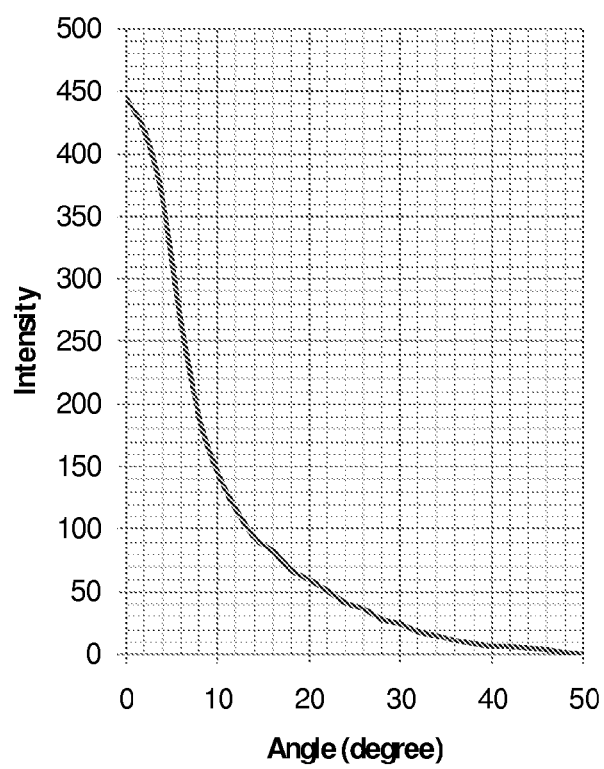
FIG. 17B shows the resulting intensity profile from the reflector lamp illustrated in FIG. 17A.

FIG. 17A is a partial side cross-sectional view of a reflector lamp 700 that can be used with any of the lighting devices described above, e.g., such as illumination device 100, shown in FIG. 1. By way of example, the H/D ratio of the illumination device 100 may be 1.00, where the diameter and height of the illumination device 100 are 12 mm. The illumination device 100 uses a single primary light emitter in the form of an LED, with an input power of 2 W, and an efficacy of 50 lm/W. The reflector lamp 700 uses a parabolic shaped reflector 702, with a focal length of 10 mm, a diameter of approximately 95 mm, and a depth (measured from the apex of the parabola to the exit aperture) of approximately 56 mm. These dimensions are merely by way of example, and other dimensions maybe used if desired. Sample rays are illustrated in FIG. 17A, without showing the ray reflections inside the cavity of the reflector lamp 700. The resulting intensity profile is illustrated in FIG. 17B. With the above-described use conditions, ray tracing simulation indicates an axial intensity of about 450 cd, at full width half maximum angle of 14°. If, in this example, an LED containing four LED chips is used, the input power can be increased by a factor of 4, and an intensity of 1800 cd would be achieved, at an input power of 8 W. Other numbers of LED chips can of course be used as well. Due to the fixed dimensions and optical properties of the sidewall of the illumination device 100, the optical design of the reflector lamp 700 does not have to change if the number of LED chips in the illumination device 100 is increased, which advantageously simplifies manufacture and reduces parts required. As illustrated in FIG. 17A, the lamp 700 may include a base 704 with a screw type 706 connector.

Figure 18A:
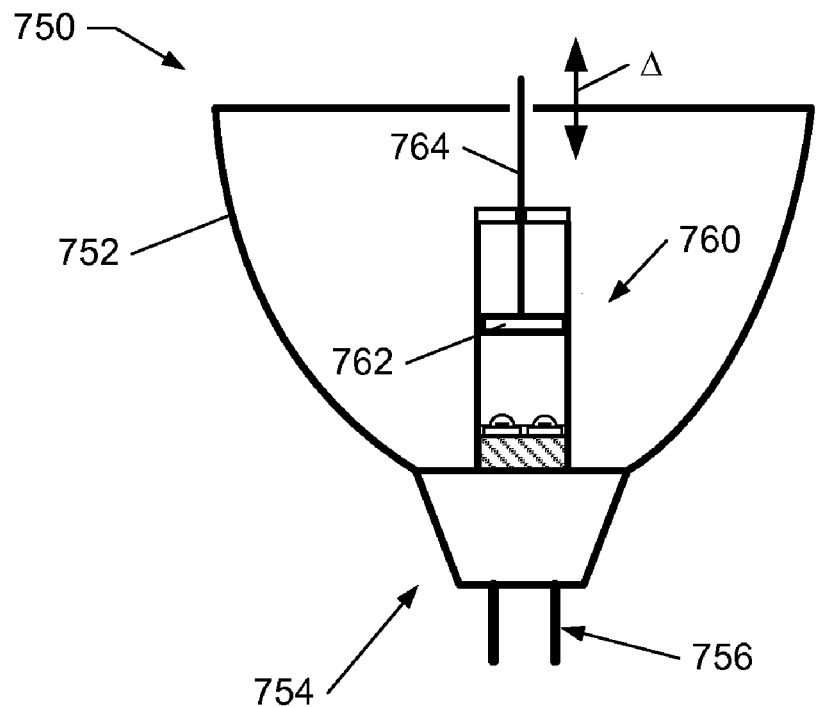
FIGS. 18A and 18B show additional embodiments of a solid state illumination device used with a reflector element to form a reflector lamp with an adjustable wavelength converting element is used.

FIG. 18A illustrates another embodiment of a reflector lamp 750 that may be used with an illumination device 760. As shown in FIG. 18A, the top element 762 of the illumination device 760 can be raised and lowered a distance Δ, e.g., by arm 764, to control the height of the emitting area of the illumination device 760. Altering the height of the emitting area of the illumination device 760 has the effect that the beam width of the reflector lamp 750 is changed, without changing the shape of the reflector 752. Lamp 750 is illustrated with a base 754 with plugs 756.

Figure 18B:
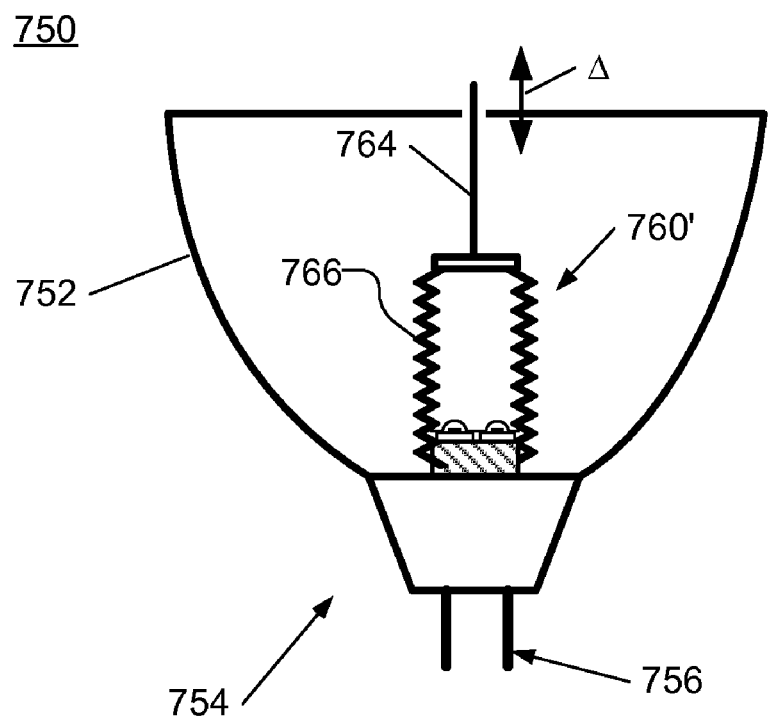

FIG. 18B illustrates another embodiment of the reflector lamp 750 with an illumination device 760' that includes corrugated sidewalls 766. The corrugated sidewalls 766 are extended or retracted, e.g., by arm 764, to control the height of the emitting area of the illumination device 760.

Figure 19A:
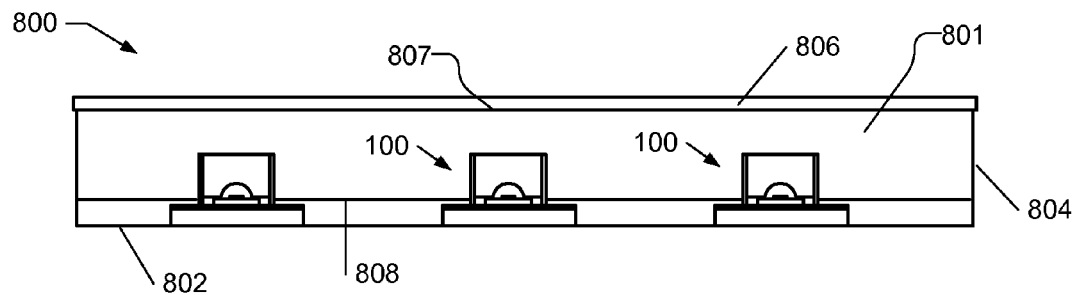
FIGS. 19A, 19B, and 19C show the use of a solid state illumination device as a backlight.
Figure 19B:
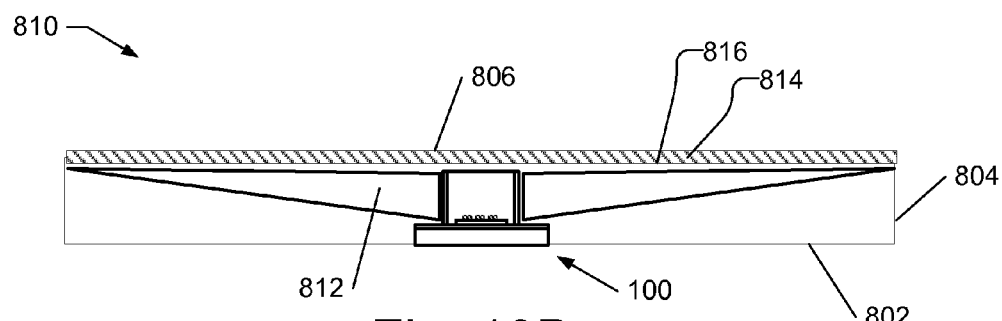
Figure 19C:
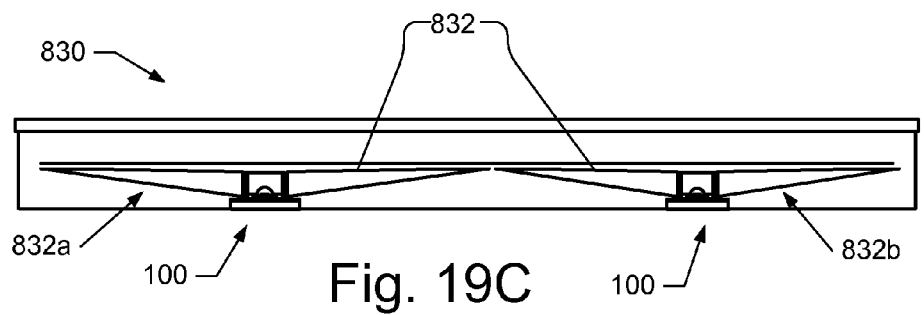

FIGS. 19A, 19B, and 19C illustrate cross-sectional side views of a commercial sign or backlight of a liquid crystal display using a solid state lighting device, such as illumination device 100 from FIG. 1. FIG. 19A shows a backlight 800 that includes a cavity 801 defined by a back surface 802, side surfaces 804, and a front plate 806. One or more of the solid state lighting devices 100, are mounted on the back surface 802 of the backlight 800. The back surface 802 may be made of a thermally conductive material, as for example aluminum, and the bottom section of each illumination device 100 is mounted such that a good thermal contact is made with the back surface 802. The back surface 802 is made of a highly reflective material, as for example the Miro material as made by Alanod (Germany), or a separate highly reflective plate or film 808 is placed at the bottom of the backlight 800 such that the reflective plate or film 808 reflects most of the light emitted by the illumination device 100 in to the side or front of the backlight 800. The front plate 806 of the backlight 800 has optically diffuse properties, for example created by adding diffuse optical layers or films 807 to it, or by adding scattering particles into the plastics or glass used for manufacture of the front plate. These types of plates are for example made by the company Fuxion Optix. In one embodiment, a wavelength converting material may be added into the scattering materials, e.g., film 807, of the front plate 806. Additional optical films might be added to the front plate 806 of the backlight 800, as commonly used in backlights for liquid crystal displays, as for example the brightness enhancement materials (BEF) made by 3M (USA), or reflective polarizers (DBEF), also made by 3M (USA). The backlight 800 advantageously produces a uniform and consistent radiation profile, without creating hot-spots directly above the lighting devices 100.

FIG. 19B illustrates a backlight 810 with a single illumination device 100, which, depending on the size and desired brightness of the backlight 810, may contain a multiple amount of LED chips. For example, for a 18 to 21 inch backlight 810, the illumination device 100 may include 6 to 9 LED chips that are 1×1 mm. The LED chips used may all be blue with, for example, a yellow or green light emitting phosphor containing cylinder as the sidewall, and a red light emitting phosphor on the top element. Alternatively, colored LEDs may be used, e.g., a combination of red light emitting (AlInGaP), green light emitting (InGaN), and blue light emitting (InGaN) LEDs. Of course, hybrid solutions are possible as well, using a green or yellow light emitting phosphor in the sidewall of the illumination device 100, and blue and red light emitting chips in the bottom section of the illumination device 100. In this configuration, it is best to use a so called chip-on-board solution, and to pack the chips closely together, and if direct emitting red AlInGaP LEDs are used, it is also beneficial to encapsulate the lighting device as shown in FIG. 4, to maximize light extraction from in specific the red chips, which are made of a materials with a high refractive index. Instead of direct green and red light emitting chips, also blue chips covered with a green and/or red light emitting phosphor layer, phosphor film, or phosphor plate can be used.

In addition to the solid state illumination device 100 in the middle of the backlight 810, an optical spreading structure 812 may be used, consisting of a rectangular, elliptical, or square light guide, with a thickness in the middle approximately equal to the height of the device, typically in the range of 3 to 9 mm, tapering off to a thickness in the range of 0.1 to 2 mm on the sides. The optical spreading structure is for example a light guide, made from PMMA, and can be made in one piece, but might be assembled from smaller pieces as well. It is especially beneficial to use multiple pieces of a large backlight needs to be obtained, as these type of light guides are preferably made by injection molding, and the molds have limited capacity with regard to size. The light guide has a hole in the middle, with a typical diameter of 3 to 13 mm, in which the device subject of this invention is placed. The gap between the sidewall of the illumination device 100 and the light guide 812 is preferably made as small as possible, but typically in the range of 0.05 to 0.5 mm.

The light from the illumination device 100 is coupled into the light guide 812 and due to the taper in the light guide 812 spreads out over the full area of the backlight 810. The light guide 812 can have extraction features in form of white dots made by screen printing, or microstructures, copied in the light guide from a mold by injection or transfer molding, in order to make the luminance distribution over the backlight more uniform, if desired.

The rear surface 802 of the backlight 810 consists of a highly reflective material as for example Miro material as made by Alanod (Germany), or MC-PET, as made by Furakawa (Japan). When a highly thermal conductive plate is used as the rear surface 802, as for example the Miro material, it is preferred to have a good thermal contact between the back of the illumination device 100, and the rear surface 802 of the backlight 810. If a nonconductive material is used, a separate heat spreader could be used.

On top of the light guide 810 an intermediate diffuser 814 can be used, e.g., in addition to the diffuser on front surface of the backlight 810. Additionally, an optical plate 816 with microstructures can be used at this position, as for example redirection film, as produced by 3M (USA). The light guide 812 is placed in the back of the backlight 810. A gap can be included between the light guide 812 and the front surface 806, intermediate diffuser 814 and optical plate 816 of the backlight 810 to improve the uniformity. Total thickness of the backlight 810 in this case is in the order of 6 to 25 mm, with a gap between the light guide 812 plus diffuser 814 and redirection film 816 and the front surface up to 20 mm. If desired, the shape of backside 802 of the backlight 810 can be tapered towards the edges, such that a thin look is created.

For large backlights, as for example used for signs, or LCD-TV, a backlight 830 having a configuration as shown in FIG. 19C can be used, consisting of multiple tapered light guides 832, with a similar shape and dimensions as shown in the embodiment of FIG. 19B, spread out over the backlight 830. The elements 832a and 832b, can be controlled independently to vary the luminance distribution over the backlight 830, for example to reduce power consumption of the backlight (in case the picture shown on the LCD does not required a uniform backlight), or to improve contrast of the picture displayed on the LCD. By way of example, if a picture has bright and dark sections, such as in a picture where the top part is bright (the sky) and the bottom section relatively dark (forest, or buildings), the light level in the bottom sections may be lowered to decrease the dark level thereby increasing the contrast.

Figure 20A:
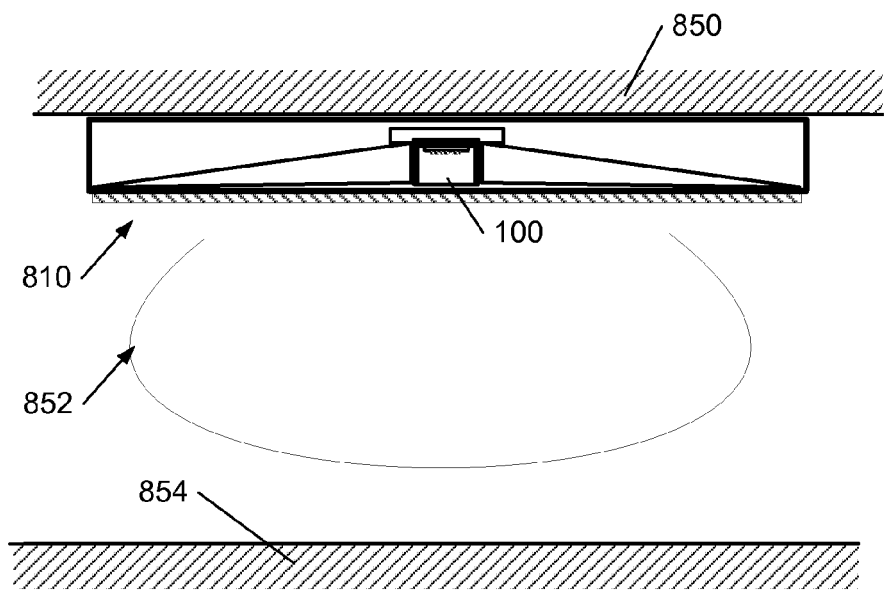
FIG. 20A shows an application of the solid state illumination device.

FIG. 20A illustrates the backlight 810 from FIG. 19B installed as an under cabinet light. The backlight 810 is mounted upside down under a cabinet 850 (only partially shown), and the light output 852 of backlight 810 is used to illuminate a working area such as shelf 854.

Figure 20B:
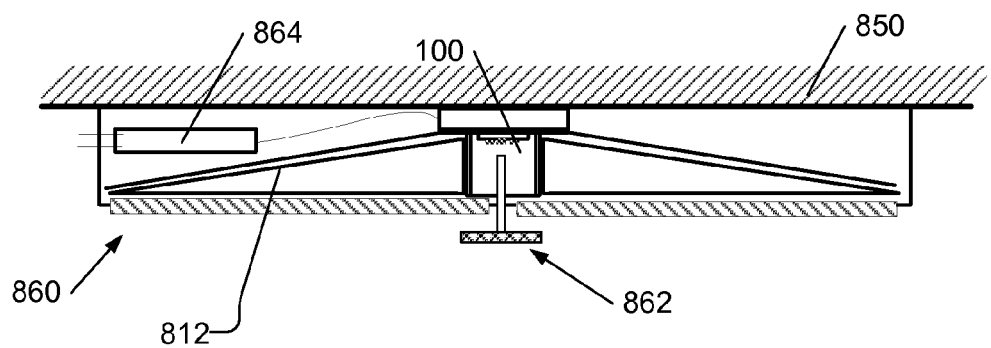
FIG. 20B illustrates the use of an adjustable wavelength converting element with an illumination device such as that illustrated in FIG. 19B.

FIG. 20B illustrates the use of an adjustable wavelength converting element 862 with a backlight 860, which is similar to backlight 810, described above, in an under cabinet lighting application, such as that illustrated in FIG. 20A. Adjustable wavelength converting element 862 may include a dye or phosphor and may be similar to adjustable wavelength converting element 502, shown in FIGS. 12A and 12B, or any of the other adjustable wavelength converting elements disclosed herein. By bringing adjustable wavelength converting element 862 into the illumination device 100, the light output of the under cabinet light can be changed, for example from a cool-white to a warm-white color temperature. As illustrated in FIG. 20B, a power supply 864 may be placed within the back light 860, e.g., behind the light guide 812.

Figures 21A, 21B:
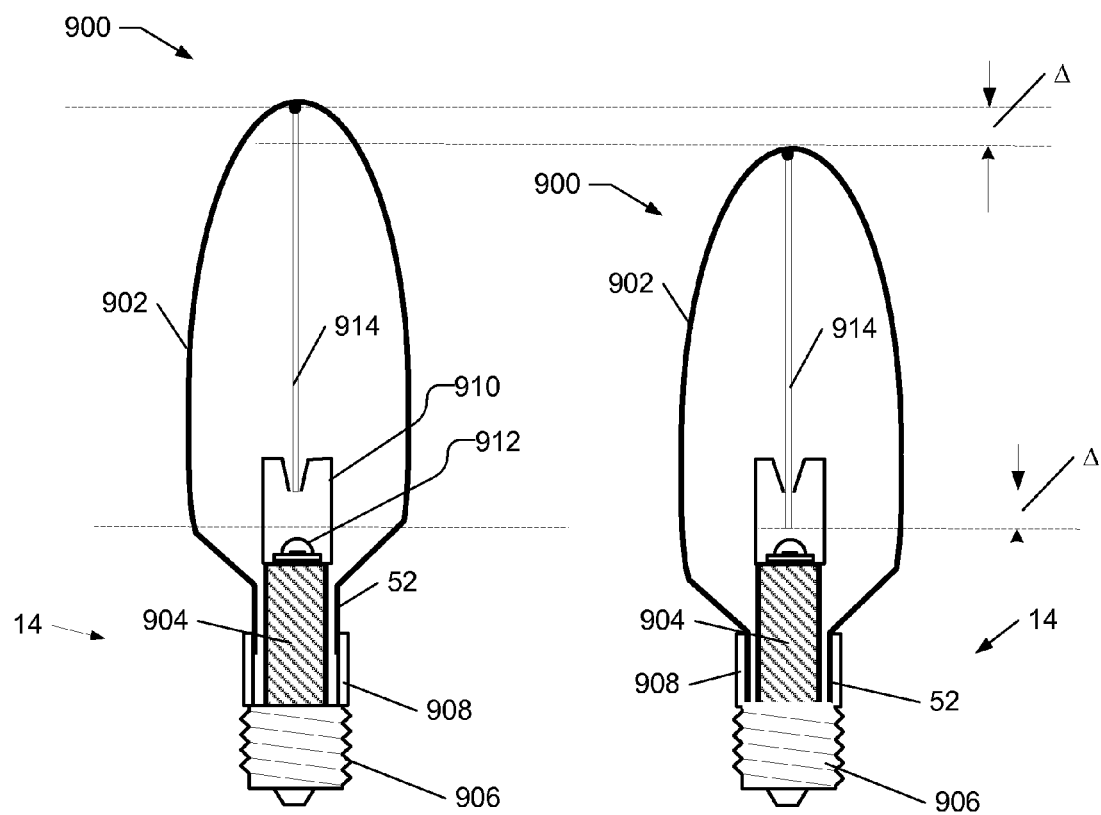
FIGS. 21A and 21B show a candle type lamp bulbs used with a solid state illumination device.

FIGS. 21A and 21B illustrate side views of another embodiment of an illumination device 900 in the form for a candle type lamp. The illumination device 900 includes a candle lamp shaped bulb 902, which can be translucent and can be made of plastic or glass. If desired, the bulb 902 may have other shapes. A chamber 910 and LED 912, similar to the illumination devices discussed above, are included and are mounted on a base 904, which is preferably made of a thermally conductive material, to enhance heat exchange by convection, and that is coupled to a screw type base 906, which is e.g., a E26-type base. The bulb 902 can include holes in the top and bottom to enhance air flow (not shown). The bulb 902 can slide in a tube 908 that is also attached to the screw type base 906. The tube 908 can also include holes to enhance air flow over the wall of the LED base 904. The LED base 904 can include a power supply for the device, and control electronics.

An adjustable wavelength converting element 914 can be moved in to or out of the chamber 910 by sliding the lamp bulb 902 down or up, respectively. In FIG. 21A, the lamp bulb 902 is in a top position, where if a red or orange light emitting phosphor is used on the adjustable wavelength converting element 914, the light output has a high correlated color temperature. In FIG. 21B the lamp bulb 902 is in a lower position, illustrated by the difference Δ between FIGS. 21A and 21B, where a low correlated color temperature would be achieved. In this embodiment, the color temperature could be set during installation of the lamp, or, if the illumination device 900 can easily be accessed by the user, during regular operation of the lamp, to adapt the color temperature of the lamp to the desired illumination effect.

Figures 22A, 22B, 22C:
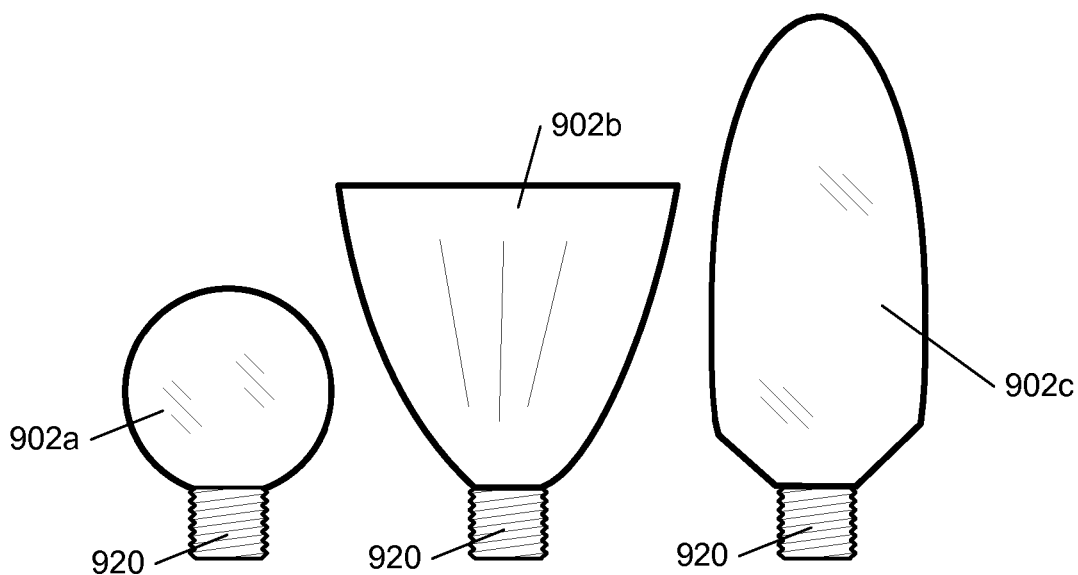
FIGS. 22A, 22B, 22C, 22D, and 22E show different bulb shapes that can be used with a solid state illumination device and mounting the bulbs so the device.
Figure 22D:
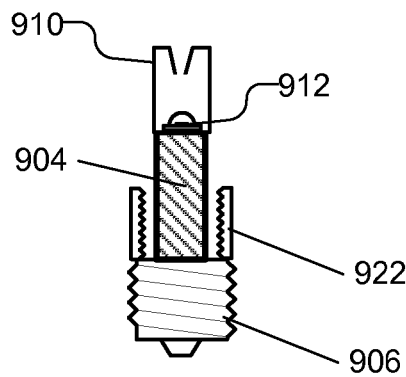
Figure 22E:
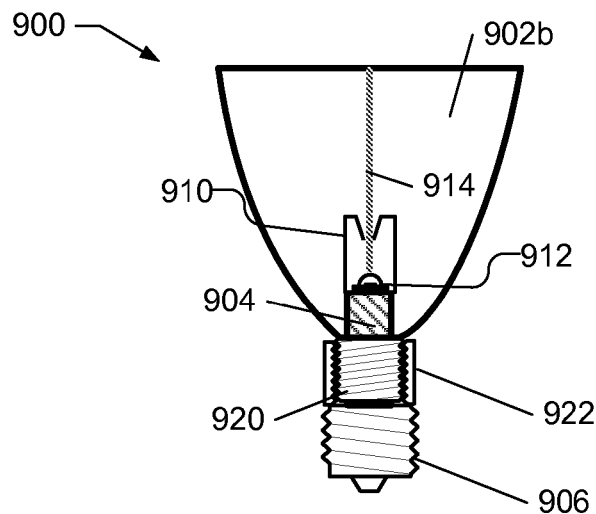

FIGS. 22A, 22B, and 22C illustrate different shaped elements 902a, 902b, and 902c, respectively, that may be used with an illumination device 900. In FIG. 22A a globe type bulb 902a is shown, which has translucent properties. FIG. 22B illustrates a reflector type enclosure 902b. FIG. 22C shows another candle type bulb 902c, similar to the one shown in FIG. 21A. In one embodiment, the different reflector/bulb elements 902 are attached to the screw type base 906 using a screw base 920. FIG. 22D illustrates a side view of the chamber 910 and LED 912, along with the screw type base 906 and a screw connector 922, which is used instead of the tube 908 shown in FIG. 21A, for receiving the screw base 920 of the bulbs 902a, 902b, and 902c. By screwing the screw base 920 of the reflector/bulb elements 902 into or out of the screw connector 922 shown in FIG. 22D, the adjustable wavelength converting element 914 is brought into or out of the chamber 910. FIG. 22E illustrates the reflector 902b coupled to the screw connector 922 with an adjustable wavelength converting element 914, which may be a phosphor loaded tube attached to the top of the reflector 902b. If desired, the illumination device 900 may be equipped with the different adjusting elements as disclosed above. Moreover, instead of controlling the color point by manipulating the reflector/bulb 902, the adjustable wavelength converting element 914 may be controlled by a separate element, such as a ring or knob that is mechanically attached to the adjustable wavelength converting element 914, and which controls the penetration of the adjusting element into the chamber 910.

Figure 23:
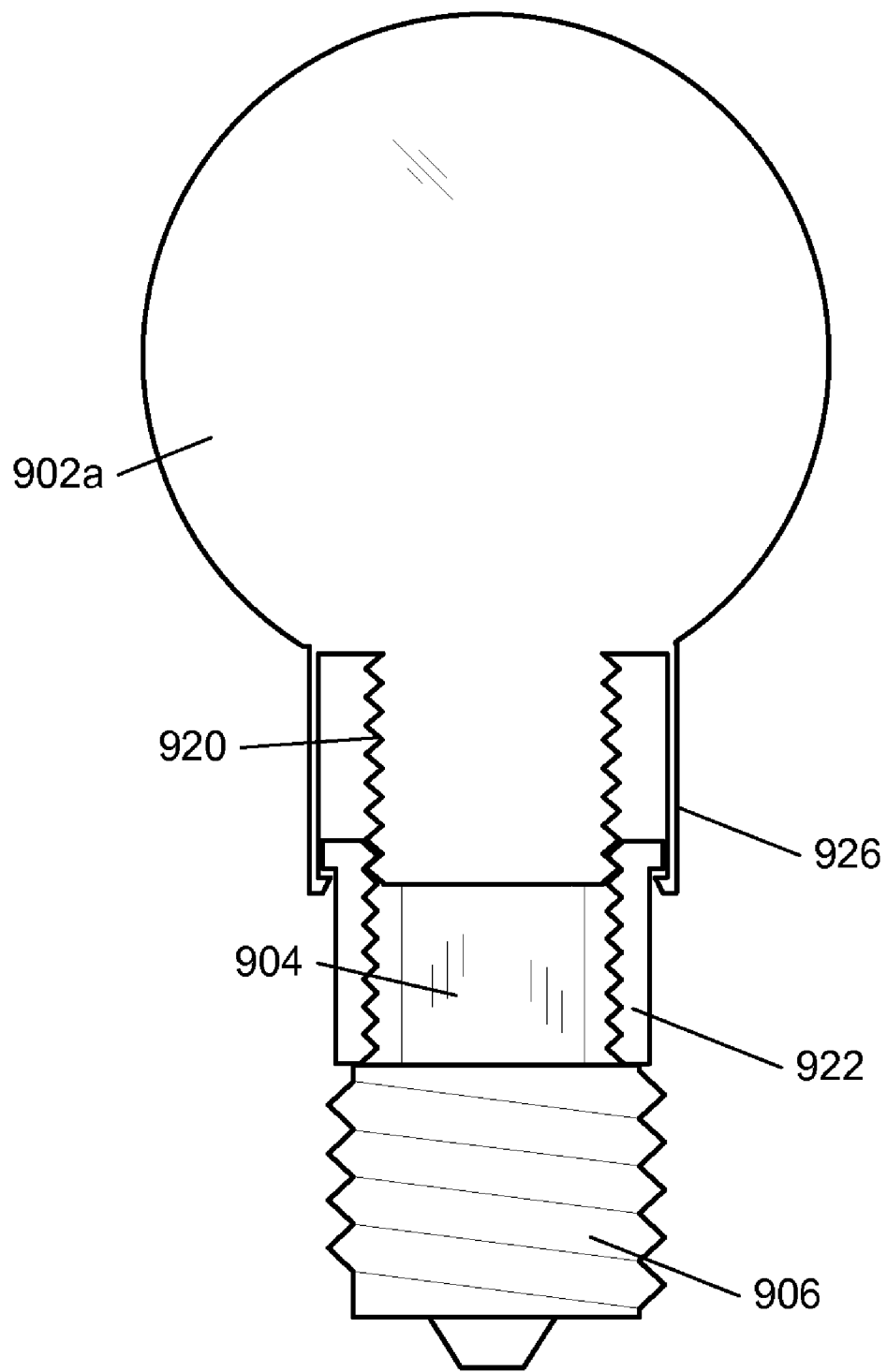
FIG. 23 shows a close-up view of the screw attachment of a bulb used with a solid state illumination device.

FIG. 23 illustrates a close-up of the screw attachment of bulb 902a, illustrated in FIG. 22A with the screw connector 922 coupled to the screw type base 906. As illustrated in FIG. 23, the bulb 902a may include clips 926 so that the bulb 902a does not become detached from the base 906 when the screw base 920 of the bulb 902a is unscrewed from the connector 922. In this way the bulb 902a can be unscrewed if it needs to be replaced. The bulb 902a can be initially attached to the base 906 and connector 922 by pressing and screwing the bulb 902a to the connector 922.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description

What is claimed is:

1. An apparatus comprising:
   at least one semiconductor light emitter operable to emit light;
   a light mixing chamber that includes a base element, at least one sidewall element and a top element, wherein the light mixing chamber is operable to receive light emitted by the at least one semiconductor light emitter;
   a first wavelength converting material having a first color light conversion property, wherein the first wavelength converting material covers a first portion of the light mixing chamber, and wherein the first portion is physically separated from the at least one semiconductor light emitter;
   a second wavelength converting material having a second color conversion property that is different than the first color conversion property, wherein the second wavelength converting material covers a second portion of the light mixing chamber that is different than the first portion, and wherein the second portion is physically separated from the at least one semiconductor light emitter.

2. The apparatus of claim 1, wherein the first portion of the light mixing chamber is a first substitutable component and the second portion of the light mixing chamber is a second substitutable component.

3. The apparatus of claim 1, wherein the first portion of the light mixing chamber comprises the at least one sidewall and the second portion of the light mixing chamber comprises the top element.

4. The apparatus of claim 1, wherein light exits the light mixing chamber through the at least one sidewall.

5. The apparatus of claim 1, wherein the second wavelength converting material is different than the first wavelength converting material.

6. An apparatus comprising:
   at least one semiconductor light emitter operable to emit light;
   a light mixing chamber that includes a base element, at least one sidewall element and a top element, wherein the light mixing chamber is operable to receive light emitted by the at least one semiconductor light emitter;
   a first wavelength converting material having a first light conversion property, wherein the first wavelength converting material covers a first portion of the light mixing chamber, and wherein the first portion is physically separated from the at least one semiconductor light emitter;
   a second wavelength converting material having a second light conversion property that is different than the first light conversion property, wherein the first wavelength converting material and the second wavelength converting material comprise different phosphors, wherein the second wavelength converting material covers a second portion of the light mixing chamber that is different than the first portion, and wherein the second portion is physically separated from the at least one semiconductor light emitter.

7. A method of producing an illumination device, the method comprising:
   measuring a wavelength and light output of at least one light emitting diode;
   selecting a first component having a first wavelength converting material with a first light conversion property based on the measured wavelength and light output of the at least one light emitting diode;
   selecting a second component having a second wavelength converting material with a second light conversion property based on the measured wavelength and light output of the at least one light emitting diode;
   assembling the at least one light emitting diode with the first component and the second component, the first component and the second component forming at least a portion of a light mixing chamber into which light from the at least one light emitting diode is emitted, wherein the first component and the second component are selected based on the measured wavelength and light output of the at least one light emitting diode to achieve a desired color point of light emitted from the light mixing chamber.

8. The method of claim 7, wherein the first component comprises at least one sidewall element of the light mixing chamber and the second component comprises a top element of the light mixing chamber.

9. The method of claim 7, wherein the first component and the second component are physically separated from the at least one light emitting diode.

10. The method of claim 7, wherein the first wavelength converting material and the second wavelength converting material comprise different phosphors.

11. The method of claim 7, wherein the first component having the first wavelength converting material is selected for at least one of the wavelength converting material, concentration, coverage factor, and thickness to produce the first light conversion property and the second component having the second wavelength converting material is selected for at least one of the wavelength converting material, concentration, coverage factor, and thickness to produce the second light conversion property.

12. The method of claim 7, wherein the first light conversion property is a first color conversion property and the second light conversion property is a second color conversion property that is different than the first color conversion property.

13. The method of claim 7, the second wavelength converting material is different than the first wavelength converting material.

14. An apparatus comprising:
   at least one semiconductor light emitter operable to emit light;
   a light mixing chamber that includes a base element, at least one sidewall element and a top element, wherein the light mixing chamber is operable to receive light emitted by the at least one semiconductor light emitter;
   a first selectable component of the light mixing chamber, the first selectable component having a first wavelength converting material with a first light conversion property, the first selectable component is selectable based on at least one of the concentration, coverage factor, and thickness of the first wavelength converting material;
   a second selectable component of the light mixing chamber, the second selectable component is physically separated from the first selectable component, the second selectable component having a second wavelength converting material with a second light conversion property, the second selectable component is selectable based on at least one of the concentration, coverage factor, and thickness of the second wavelength converting material;
   wherein the first selectable component and the second selectable component convert the light emitted by the at least one semiconductor light emitter to produce light with a desired color point.

15. The apparatus of claim 14, wherein the first wavelength converting material and the second wavelength converting material comprise different phosphors.

16. The apparatus of claim 14, wherein the first selectable component comprises the at least one sidewall and the second selectable component comprises the top element.

17. The apparatus of claim 14, wherein light exits the light mixing chamber through the at least one sidewall element.

18. The apparatus of claim 14, wherein the first light conversion property is a first color conversion property and the second light conversion property is a second color conversion property that is different than the first color conversion property.

19. The apparatus of claim 14, wherein the second wavelength converting material is different than the first wavelength converting material.

* * * * *